(12) United States Patent
Wohl et al.

(10) Patent No.: US 7,237,162 B1
(45) Date of Patent: Jun. 26, 2007

(54) DETERMINISTIC BIST ARCHITECTURE TOLERANT OF UNCERTAIN SCAN CHAIN OUTPUTS

(75) Inventors: Peter Wohl, Williston, VT (US); John A. Waicukauski, Tualatin, OR (US)

(73) Assignee: Synopsys, Inc., Mountain View, CA (US)

(*) Notice: Subject to any disclaimer, the term of this patent is extended or adjusted under 35 U.S.C. 154(b) by 628 days.

(21) Appl. No.: 10/263,334

(22) Filed: Oct. 1, 2002

Related U.S. Application Data

(63) Continuation-in-part of application No. 09/950,292, filed on Sep. 7, 2001, now Pat. No. 6,950,974.

(51) Int. Cl.
*G01R 31/28* (2006.01)

(52) U.S. Cl. .................. 714/726; 714/738; 714/729

(58) Field of Classification Search .................. None
See application file for complete search history.

(56) References Cited

U.S. PATENT DOCUMENTS

| 4,503,537 | A | * | 3/1985 | McAnney | .................. 714/728 |
| 5,774,477 | A | | 6/1998 | Ke | |
| 6,148,425 | A | | 11/2000 | Bhawmik et al. | |
| 6,272,653 | B1 | * | 8/2001 | Amstutz | .................. 714/724 |
| 6,463,561 | B1 | | 10/2002 | Bhawmik et al. | |
| 6,543,020 | B2 | * | 4/2003 | Rajski et al. | .................. 714/738 |
| 6,557,129 | B1 | * | 4/2003 | Rajski et al. | .................. 714/729 |
| 6,684,358 | B1 | * | 1/2004 | Rajski et al. | .................. 714/739 |
| 6,829,740 | B2 | * | 12/2004 | Rajski et al. | .................. 714/729 |
| 2002/0053057 | A1 | * | 5/2002 | Rajski et al. | .................. 714/738 |
| 2003/0120988 | A1 | * | 6/2003 | Rajski et al. | .................. 714/726 |
| 2003/0131298 | A1 | * | 7/2003 | Rajski et al. | .................. 714/738 |
| 2004/0128599 | A1 | * | 7/2004 | Rajski et al. | .................. 714/726 |

FOREIGN PATENT DOCUMENTS

EP          0 372 226 A2  * 10/1990

OTHER PUBLICATIONS

"Low Cost Concurrent Test Implementation For Linear Digital Systems", by Bayraktaroglu et al., IEEE European Test Workshop Proceddings, 200 Publication Date: May 23-26, 2000 p. 140-143 Inspec Accession No.: 6788978.
"LFSR-Coded Test Patterns for Scan Designs" by Dr. Bernd Könemann; 6 pgs.

(Continued)

*Primary Examiner*—Phung My Chung
(74) *Attorney, Agent, or Firm*—Beaver, Hoffman & Harms, LLP; Jeanette S. Harms

(57) ABSTRACT

A BIST architecture that allows efficient compression and application of deterministic ATPG patterns while tolerating uncertain bits is provided. In accordance with one feature of the invention, a large number of short scan chains can be configured between a decompressor and an observe selector. The observe selector selectively presents values of specific scan chains or scan cells to an external tester, thereby significantly reducing test data and test cycles. Advantageously, the core of the tested device is not changed as would be the case in BIST architectures including MISRs. Moreover, test points or logic to block uncertain bits do not need to be inserted. Furthermore, the loaded care bits for the scan chains as well as the bits for controlling the observe selector can be deterministically controlled, thereby providing optimal testing flexibility.

12 Claims, 24 Drawing Sheets

OTHER PUBLICATIONS

"Logic DFT and Test Resource Partitioning for 100M Gate ASICs Part I: Current Chip-Level DFT Methodology Overview" by Bernd Könemann et al.; pp. 1-4.

"Logic DFT and Test Resource Partitioning for 100M Gate ASICs Part II: LBIST Overview" by Bernd Könemann et al.; pp. 1-5.

"Logic DFT and Test Resource Partitioning for 100M Gate ASICs Part III: SmartBIST™ Roadmap" by Bernd Könemann et al.; pp. 1-5.

"A Pattern Skipping Method for Weighted Random Pattern Testing" by Bernd Könemann; pp. 418-425.

* cited by examiner

```
while ( #links_made < #outputs &&                    845
        #links_made < #active_inputs) { while (some outputs connect to only 1 active input) {
        link input to output
        mark input inactive, mark output used
        clear input's row in connectivity matrix
    } while (some inputs connect to only 1 active output) {
        link input to output
        mark input inactive, mark output used
        clear output's column in connectivity matrix
    } link input of output that connects to least active inputs
    mark input inactive, mark output used
```

Figure 8E

| | Output 1 | Output 2 | Output 3 | Output 4 | Output 5 |
|---|---|---|---|---|---|
| Input 10 | | | | | 0 |
| Input 9 | | | | | 0 |
| Input 8 | | C | | | 0 |
| Input 7 | C | C | | | 0 |
| Input 6 | | | | | 0 |
| Input 5 | | | | | 1 |
| Input 4 | 0 | 0 | 1 | 0 | 0 |
| Input 3 | | | | | 0 |
| Input 2 | | | | | 0 |
| Input 1 | | | | | 0 |

```
Pattern "_pattern_" {                                    1000
    . . .
    "pattern i":
    // load/unload
    Macro "shadows_load_unload" {
        "shadow_si1"=100 . . . //pat. i+1
        "observe_i1"=010 . . .//pat. i+1
        "so1"=HXL . . . // pattern i-1
    }
    "forcePI" : V { "_pi"=0011ZN . . . }
    "measurePO": V { "_po"=HLHTXX . . . }
    // capture
    V { "bist_clk"=P; "CLOCK"=P; }
}
```

Figure 10

```
MacroDefs {
    "shadows_load_unload" {                              1100
        ScanStructures shadows;
        Loop 10 {
            V { "bist_clk"=P; "CLOCK"=P; }
        }
        Shift {
            V { "shadow_si1"=#;
                 . . . .
                "shadow_si8"=#;
                "observe_i1"=#;
                 . . . .
                "observe_i7"=#;
                "observe_i8"=01010101 . . .
                "sol"=#;
                 . . . .
                "bist_col"=P; "CLOCK"=P;
            }
        }
        C { "shadow_transfer"=1; }
}}
```

Figure 11

DETERMINISTIC BIST ARCHITECTURE TOLERANT OF UNCERTAIN SCAN CHAIN OUTPUTS

RELATED APPLICATIONS

The present application is a continuation-in-part of commonly owned U.S. patent application Ser. No. 09/950,292, "EFFICIENT COMPRESSION AND APPLICATION OF DETERMINISTIC PATTERNS IN A LOGIC BIST ARCHITECTURE" filed Sep. 7, 2001 now U.S. Pat. No. 6,950,974 by Peter Wohl, John A. Waicukauski and Thomas W. Williams.

BACKGROUND OF THE INVENTION

1. Field of the Invention

The embodiments of the present invention relate to a deterministic built-in self test (DBIST) architecture, and particularly to a DBIST architecture tolerant of uncertain scan chain outputs.

2. Description of the Related Art

Larger and more complex logic designs in integrated circuits (ICs) lead to demands for more sophisticated testing to ensure fault-free performance of those ICs. This testing can represent a significant portion of the design, manufacture, and service cost of integrated circuits (ICs). In a simple model, testing of an IC can include applying multiple test patterns to the inputs of a circuit and monitoring its outputs to detect the occurrence of faults. Fault coverage indicates the efficacy of the test patterns in detecting each fault in a universe of potential faults. Thus, if a set of test patterns is able to detect substantially every potential fault, then fault coverage approaching 100% has been achieved.

To facilitate better fault coverage and minimize test cost, DFT (design-for-test) can be used. In one DFT technique, structures in the logic design can be used. Specifically, a logic design implemented in the IC generally includes a plurality of state elements, e.g. sequential storage elements like flip-flops. These state elements can be connected into scan chains of computed lengths, which vary based on the design. In one embodiment, all state elements in a design are scannable, i.e. each state element is in a scan chain. The state elements in the scan chains are typically called scan cells. In DFT, each scan chain includes a scan-input pin and a scan-output pin, which serve as control and observation nodes during the test mode.

The scan chains are loaded by clocking in predetermined logic signals through the scan cells. Thus, if the longest scan chain includes 500 scan cells, then 500 clock cycles are used to complete the loading process. Note that, for simplicity, the embodiments provided herein describe scan chains of equal length. In actual embodiments, DFT attempts to create, but infrequently achieves, this goal. Thus, in actual embodiments, software can compensate for the different scan chain lengths, thereby ensuring that outputs from each test pattern are recognized and analyzed accordingly. This methodology is known by those skilled in the art and therefore is not explained in detail herein.

The test patterns for the scan chains can be generated using an external testing device. Using such a device, an exhaustive test can be done by applying $2^N$ input patterns to a design with N inputs and scan cells. However, this test approach rapidly is commercially impractical as the number of inputs increases.

To solve this problem, deterministic automatic test pattern generation (ATPG) can be used to generate a smaller set of patterns while providing fault coverage close to 100%. Specifically, in deterministic ATPG, each test pattern is designed to test for as many faults as possible. However, even with the reduction in test patterns, deterministic ATPG patterns still require significant storage area in the test-application equipment (tester) for the large number of patterns that are input directly to the scan chains, and for the expected output values from the scan chains. Moreover, this test method has associated inefficiencies because of its off-chip access time.

Alternatively, and more frequently in current, complex ICs, structures can be added to the design that allow the IC to quickly test itself. These built-in self-test (BIST) structures can include various pattern generators, the most typical being a pseudorandom pattern generator (PRPG). After the patterns generated by the PRPG are propagated through the scan chains in the tested design, the outputs are analyzed to determine if a fault is detected.

FIG. 1A illustrates a logic BIST architecture 100 for testing a design 130 having six scan chains 131–136. In this embodiment, architecture 100 includes a linear feedback shift register (LFSR) 110 to implement the PRPG. PRPG-LFSR 110 includes a plurality of sequential storage elements (in a typical embodiment, flip-flops) 111–114 that are connected in series with a feedback loop and one XOR operation (indicated by the circled plus sign). As shown in FIG. 1A, the flow of signals in these interconnected flip-flops is from left to right. Note that a linear feedback shift register has a characteristic polynomial that is expressed in terms of its feedback connections. In this embodiment, PRPG-LFSR 110 implements the polynomial $f(x)=x^4+x^3+1$. Other embodiments can implement other polynomials, preferably primitive polynomials.

As shown in FIG. 1B, if an LFSR 180 generates bit sequences, i.e. the test patterns, directly for scan chains 181–184, then those bit sequences differ by only a few bits, i.e. phase shifts. These small phase shifts can undesirably reduce the fault coverage. As a result, in architecture 100, a phase shifter 120 is provided to transform the outputs of PRPG-LFSR 110 into uncorrelated signals. Phase shifter 120 is described in further detail in "Built-In Test for VLSI: Pseudorandom Techniques", by P. H. Bardell et al., page 176, John Wiley & Sons, 1987. Thus, the values from PRPG-LFSR 110 are loaded into scan chains 131–136 in a manner controlled by the various XOR operations in phase shifter 120. In this embodiment, scan chain 131 includes an input scan pin si1 and an output scan pin so1. Scan chains 132–136 include corresponding scan pins si2/so2, si3/so3, si4/so4, si5/so5, and si6/so6, respectively.

Compactor 140 compacts the outputs from tested design 130 and provides inputs to a multiple input signature register (MISR) LFSR 150, which includes a plurality of storage elements 151–154 coupled in series with various XOR operations and feedback loops. In this embodiment, MISR-LFSR 150 implements the polynomial $f(x)=x^4+x+1$. After several cycles, MISR-LFSR 150, described in further detail in "Built-In Test for VLSI: Pseudorandom Techniques", by P. H. Bardell et al., page 119, John Wiley & Sons, 1987, provides a "signature" that is a near-unique checksum for a given sequence of its input values. At this point, the state of MISR-LFSR 150 can be compared to the known "signature" of the fault-free design, wherein a mismatch indicates that at least one erroneous value was unloaded from scan chains 131–136. This erroneous value can be used to determine that a fault exists in tested design 130.

FIG. 1C illustrates a graph plotting fault coverage versus number of pseudorandom test patterns. As seen in FIG. 1C, pseudorandom pattern generation has two disadvantages. First, the final fault coverage is signficantly less than 100%. Generally, a PRPG provides fault coverage in the range of 70–80%, which is unacceptable for many IC applications. Moreover, as the number of test patterns increases, the detection of faults becomes significantly less efficient (as is the case in deterministic ATPG). Specifically, pseudorandom pattern generation is very efficient in removing easy-to-detect faults from a fault list in the beginning of the test process, but is less efficient in removing hard-to-detect (i.e. circuit dependent) faults near the end of the test process. In fact, to achieve acceptable test coverage, the number of PRPG patterns must be significantly larger than the number of deterministic ATPG patterns to provide the same fault coverage. Therefore, using PRPG forces a trade-off between reduced test coverage and reduced tester storage data.

Several solutions have been proposed to address this problem, each having associated disadvantages. In one solution, the number of scan chains can be increased, thereby reducing the number of pattern load/unload clock cycles. However, the tester storage volume is still unreasonably large for typical industry applications. In a second solution, test points can be added to the design, thereby increasing the probability of fault detection by pseudorandom patterns. This solution is undesirable because it increases silicon area and the propagation delay of critical timing paths. In a third solution, the pseudorandom patterns can be biased or modified to test for random-resistant faults. However, this solution adds significant silicon area to the design and/or increases data volume stored in the tester. In a fourth solution, deterministic ATPG patterns can be added to BIST patterns for a more complete test coverage. However, this solution significantly increases the data volume stored in the tester.

Finally, in a fifth solution, the PRPG is initialized, i.e. seeded, such that predetermined scan cells are set to values, after a suitable number of cycles of the PRPG, that achieve detection of targeted faults. The values stored in these predetermined scan cells, called "care bits", are typically much fewer (i.e. on the order of hundreds) than the "don't care bits" (i.e. on the order of hundreds of thousands) stored in the other scan cells. This solution is described in further detail in "LFSR-Coded Test Patterns for Scan Designs", by B. Könemann, Munich 1991. This solution requires serially loading the seeds into the PRPG. In FIG. 1A, four clock cycles are needed to load PRPG-LFSR 110. However, an actual implementation of PRPG-LFSR 110 could include hundreds of storage elements, thereby requiring a corresponding number of cycles to load. Thus, this solution can also significantly increase the test application time. Therefore, a need arises for a pseudorandom pattern generation system and method that minimizes test application time while achieving fault coverage comparable to deterministic ATPG.

Moreover, referring back to FIG. 1A, which illustrates a standard logic BIST architecture 100, tested design 130 can occasionally output uncertain outputs that can corrupt the signature generated by MISR LFSR 150. These uncertain outputs can be caused by floating buses, race conditions, and un-initialized components in the design. Although tested design 130 can be modified to eliminate these uncertain outputs, the inconvenience and inefficiency of changing the design merely for test purposes renders such additional step(s) highly undesirable. Therefore, a further need arises for a system and method that filters the outputs of the scan chains, thereby ensuring that any uncertain outputs are not provided to the MISR.

SUMMARY OF THE INVENTION

An XDBIST architecture that allows efficient compression and application of deterministic ATPG patterns while tolerating uncertain bits is provided. In accordance with one feature of the invention, a large number of short scan chains can be configured between a decompressor and an observe selector. The observe selector selectively presents values of specific scan chains or scan cells to an external tester, thereby significantly reducing test data and test cycles. Specifically, compared to deterministic ATPG, test data volume can be reduced by a factor of 10 and test cycles by a factor of 10 or more.

Advantageously, the core of the tested device is not changed as would be the case in DBIST architectures including MISRs. Moreover, test points or logic to block uncertain bits do not need to be inserted. Furthermore, the loaded care bits for the scan chains as well as the bits for controlling the observe selector can be deterministically controlled, thereby providing optimal testing flexibility.

A system for implementing the XDBIST architecture can include a linear feedback shift register (LFSR) for generating a pattern from a seed. A phase-shifter can decompress the first pattern from the LFSR and provide the decompressed pattern to a plurality of scan chains. In accordance with one feature of the invention, an observe selector can select predetermined scan chain outputs from the plurality of scan chains for testing, wherein the selected scan chain outputs can include uncertain scan chain outputs. The system can further include a set of shadow registers. Each shadow register receives a portion of the seed, thereby significantly decreasing the loading time of the seed.

The observe selector can include a scan-out selector. In one embodiment, the scan-out selector has two sets of multiplexers. The first set of multiplexers receives the scan chain outputs, wherein each scan chain provides its scan chain output to two multiplexers in the first set. The second set of multiplexers receives outputs from the first set of multiplexers, wherein each multiplexer in the first set of multiplexers provides its output to two multiplexers in the second set. Each of the second set of multiplexers provides a scan output that can be observed by the tester.

The observe selector can further include a logic gate network for controlling the first set of multiplexers, but not the second set of multiplexers. The logic gate network could include XOR logic gates or any other type or combination of logic gates performing an appropriate selection function. The observe selector can further include a set of shadow registers and a scan out register. Each shadow register can include a plurality of storage elements serially coupled, wherein each shadow register receives a portion of an observe seed. The scan-out register receives the observe seed once loaded and provides the loaded observe seed to the logic gate network and the second set of multiplexers.

In another embodiment, the observe selector can include a set of shadow registers, wherein each shadow register receives a portion of an observe seed. A second linear feedback shift register (LFSR) can generate a pattern based on the observe seed. A second phase-shifter can decompress that pattern and use the decompressed pattern to control a set of multiplexers.

A method of routing signals through a multi-stage scan-out selector in a built in self test (BIST) architecture is also provided. In this method, a new set of scan chains can be marked as active inputs to the multi-stage scan-out selector. A first connectivity matrix can be built for a first stage of the multi-stage scan-out selector. In one embodiment, inputs to the first stage are represented as rows in the connectivity matrix and outputs are represented as columns. Note that the active inputs are a subset of the inputs to the first stage.

At this point, an attempt can be made to link the set of active inputs to outputs in the first connectivity matrix. If the set of active inputs cannot be linked to the outputs, then another scan chain can be substituted for the last-added scan chain in the set of scan chains. The process can then return to the step of marking. If the set of active inputs can be linked to the outputs, then any remaining unused links in the first stage can be assigned in a predetermined order.

After routing of the set of active inputs can be provided in the first stage, a second connectivity matrix can be built for routing in the second stage of the multi-stage scan-out selector. Once again, inputs to the second stage can be represented as rows in the second connectivity matrix and outputs as columns. Then, an attempt can be made to link inputs to outputs in the second connectivity matrix. If the set of active inputs cannot be linked to the outputs, then another scan chain can be substituted for the last-added scan chain in the set of scan chains. The process can then return to the first step of marking. If the set of active inputs can be linked to the outputs, then the process determines whether a maximum desired set of active inputs is reached. If not, then a new scan chain can be added to the set and the process returns to the first step of marking. If so, then the routing analysis ends for that pattern.

Attempting to link the set of active inputs to outputs in the first or second connectivity matrices can include determining whether an output is connected to only one active input. If so, then the input can be linked to the output, the input can be marked inactive, the output can be marked as used, and the input row in the connectivity matrix can be cleared. Attempting to link the set of active inputs to outputs can further include determining whether an input is connected to only one unused output. If so, then the input can be linked to the output, the input can be marked inactive, the output can be marked as used, and the output column in the connectivity matrix can be cleared. Attempting to link the set of active inputs to outputs can further include determining an input of an output that connects to least active inputs. In this case, the input can be linked to the output and the input can be marked inactive. In one embodiment, all the above steps are performed until no more faults exist.

BRIEF DESCRIPTION OF THE DRAWINGS

FIG. 8E illustrates one embodiment of pseudo-code for implementing a specific step in the algorithm of FIG. 8D.

FIG. 8F illustrates a connectivity matrix for an exemplary stage of multiplexers.

FIG. 10 shows an exemplary code portion for an XDBIST pattern that could be provided to a tester.

FIG. 11 shows an exemplary "shadows_load_unload" macro.

DETAILED DESCRIPTION OF THE DRAWINGS

An architecture that allows efficient compression and application of deterministic ATPG patterns while tolerating uncertain bits is provided. This architecture, called XDBIST herein, includes a large number of short scan chains that can be configured between a decompressor and an observe selector. The observe selector selectively presents values of specific scan chains or scan cells to an external tester, thereby significantly reducing test data and test cycles. The XDBIST architecture advantageously uses scan-in data reduction described in U.S. patent application Ser. No. 09/950,292, "EFFICIENT COMPRESSION AND APPLICATION OF DETERMINISTIC PATTERNS IN A LOGIC BIST ARCHITECTURE" filed Sep. 7, 2001 by Peter Wohl, John A. Waicukauski and Thomas W. Williams, which is incorporated herein by reference. Portions of that description are provided below herein for clarity.

PRPG Shadow Registers Reduce Test Application Time

Figure 1A:
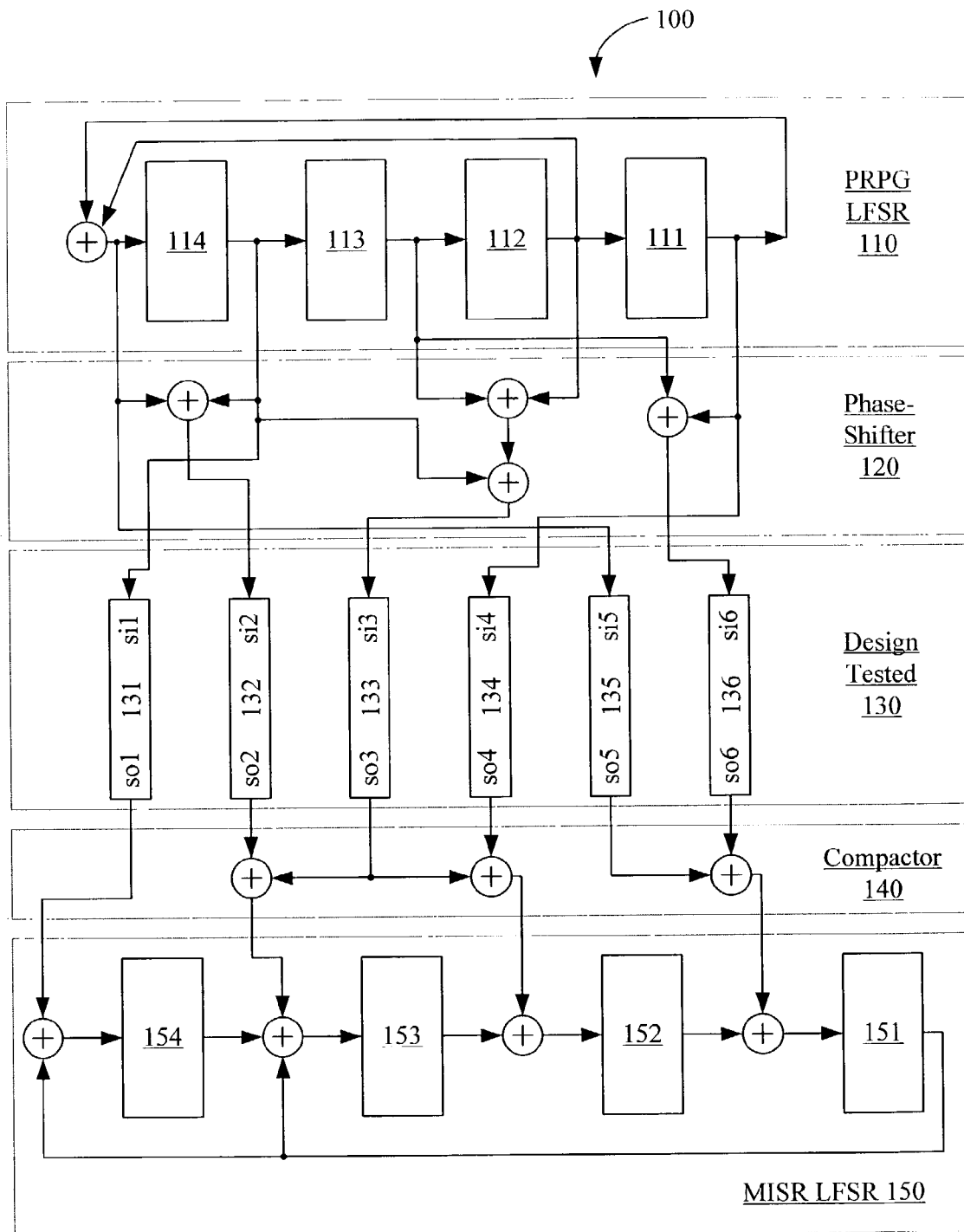
FIG. 1A illustrates a built-in self-test architecture for providing pseudorandom pattern generation.
Figure 1B:
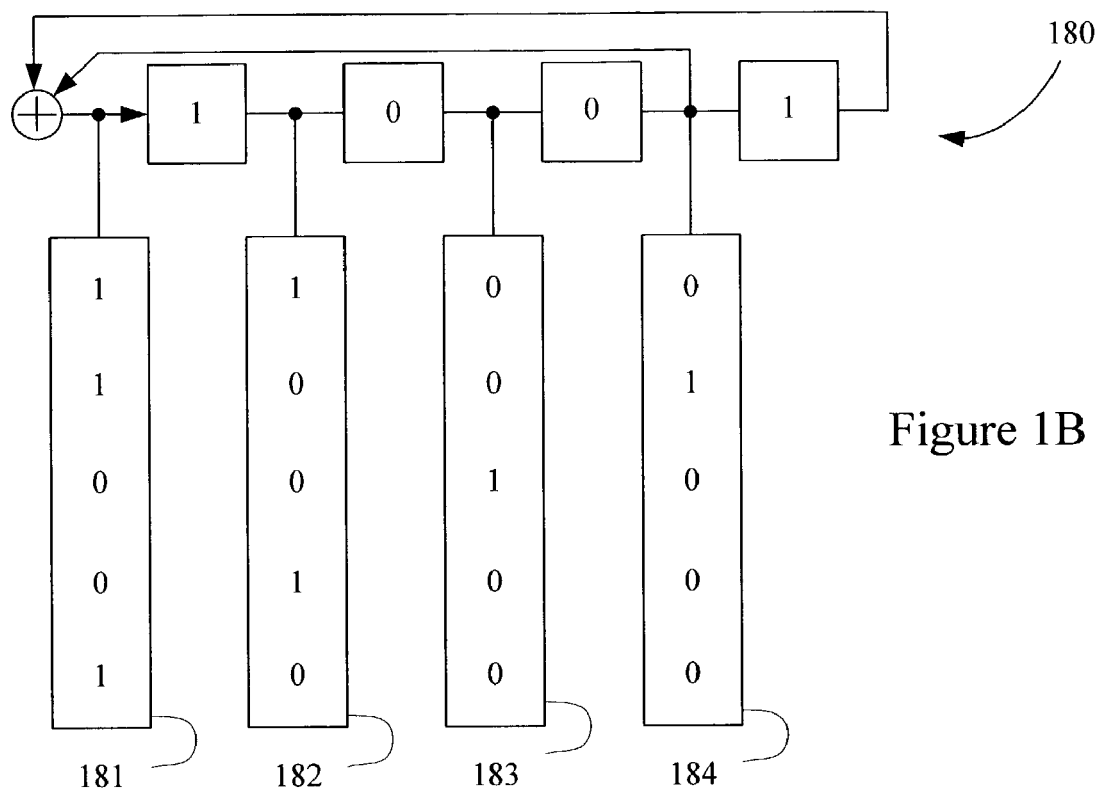
FIG. 1B illustrates an LFSR generating bit sequences for a plurality of scan chains.
Figure 1C:
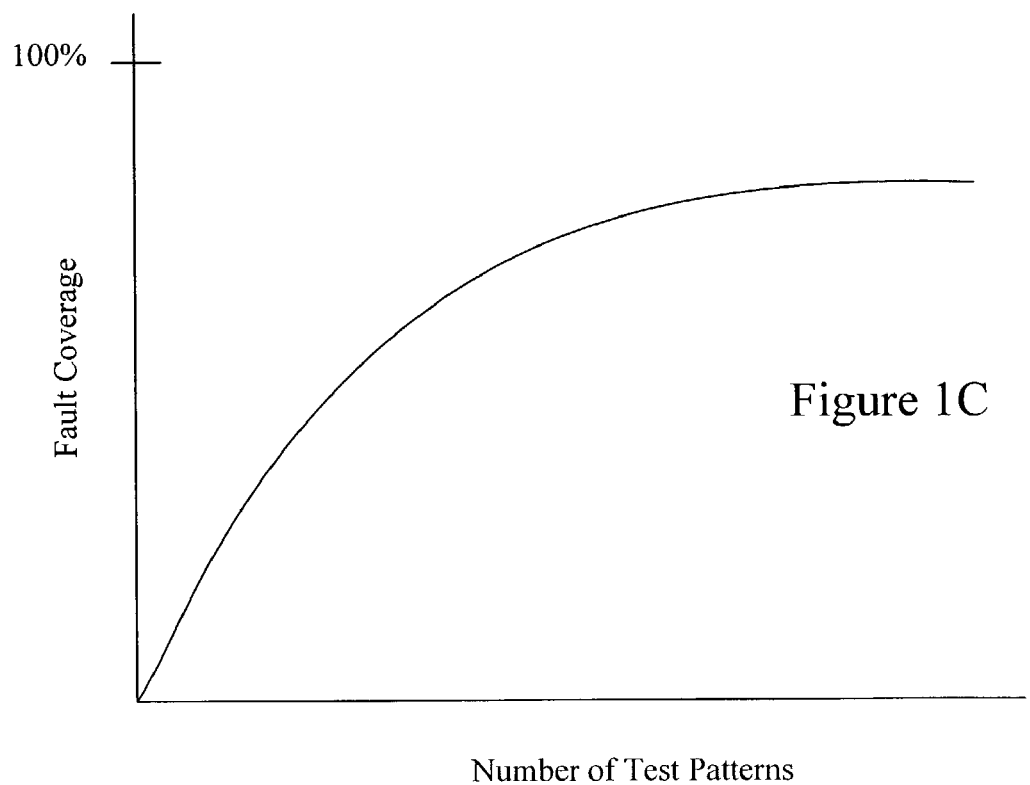
FIG. 1C illustrates a graph plotting fault coverage versus number of test patterns.
Figure 2A:
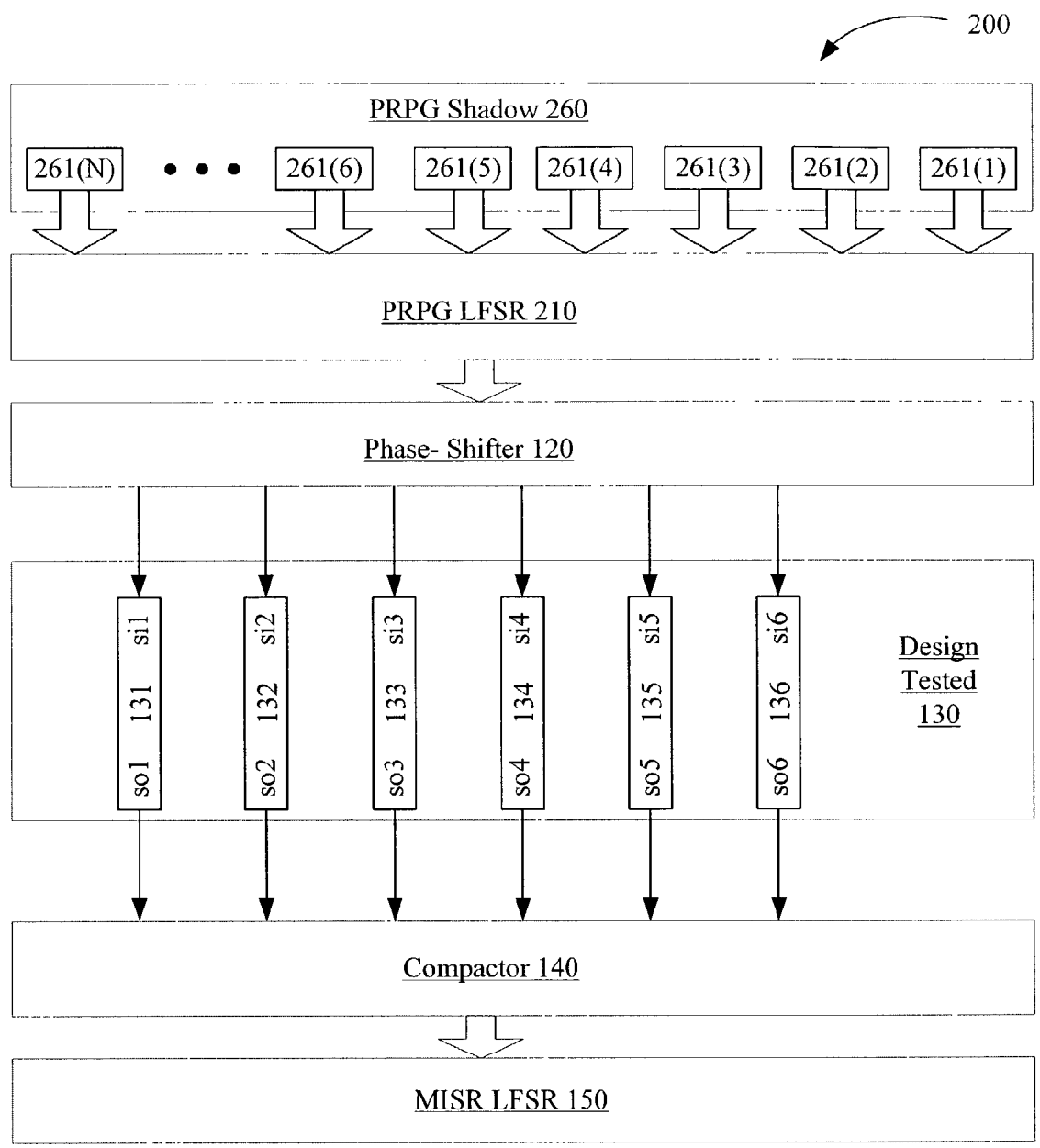
FIG. 2A illustrates a built-in self-test architecture including a PRPG shadow for seeding a PRPG-LFSR.

FIG. 2A illustrates a logic BIST architecture 200 in which a PRPG-LFSR 210 selectively receives signals from a PRPG shadow 260. PRPG shadow 260 includes N PRPG shadow registers 261, wherein each shadow register includes M serially coupled storage elements (not shown, but explained in further detail in reference to FIG. 2B) (wherein both N and M are integers greater than 2). Of importance, the total number of storage elements in PRPG shadow registers 261, i.e. N×M storage elements, is equal to the number of storage elements in PRPG-LFSR 210. PRPG shadow registers 261 can be loaded in parallel. Thus, the number of clock cycles to load these shadow registers is equal to the number of storage elements in each shadow register, i.e. M.

To determine the values of N and M, the number of care bits to be set as well as the longest length of the scan chains of tested design 130, i.e. scan chains 131–136, should be considered. The length of PRPG-LFSR 210 (N×M) minus 10 approximately equals the maximum number of care bits that may be set for a single seed, which may be used for a plurality of patterns. Moreover, during the last stages of testing approximately 240 care bits may be needed to be set within a single pattern. Therefore, in one embodiment, 256 storage elements are provided in PRPG-LFSR 210 (wherein 256−10>240). Thus, because the total number of storage elements in PRPG shadow 260 is equal to the number of storage elements in PRPG-LFSR 210, N×M should be equal to 256.

In one embodiment, each scan chain 131–136 includes 32 scan cells, thereby requiring 32 clock cycles to provide outputs from the seed provided by PRPG-LFSR 210 (via phase shifter 120). Note that other embodiments can include more or less scan cells per scan chain. In accordance with one feature of the present invention, PRPG shadow 260 can be fully loaded in the number of clock cycles it takes to load scan chains 131–136 (in this embodiment, 32 clock cycles). To provide this loading characteristic, the number (M) of storage elements in each PRPG shadow register 261 can be set to 32. Therefore, in this embodiment, 8 PRPG shadow registers 261 can be provided in PRPG shadow 260 (256÷32=8=N).

Figure 2B:
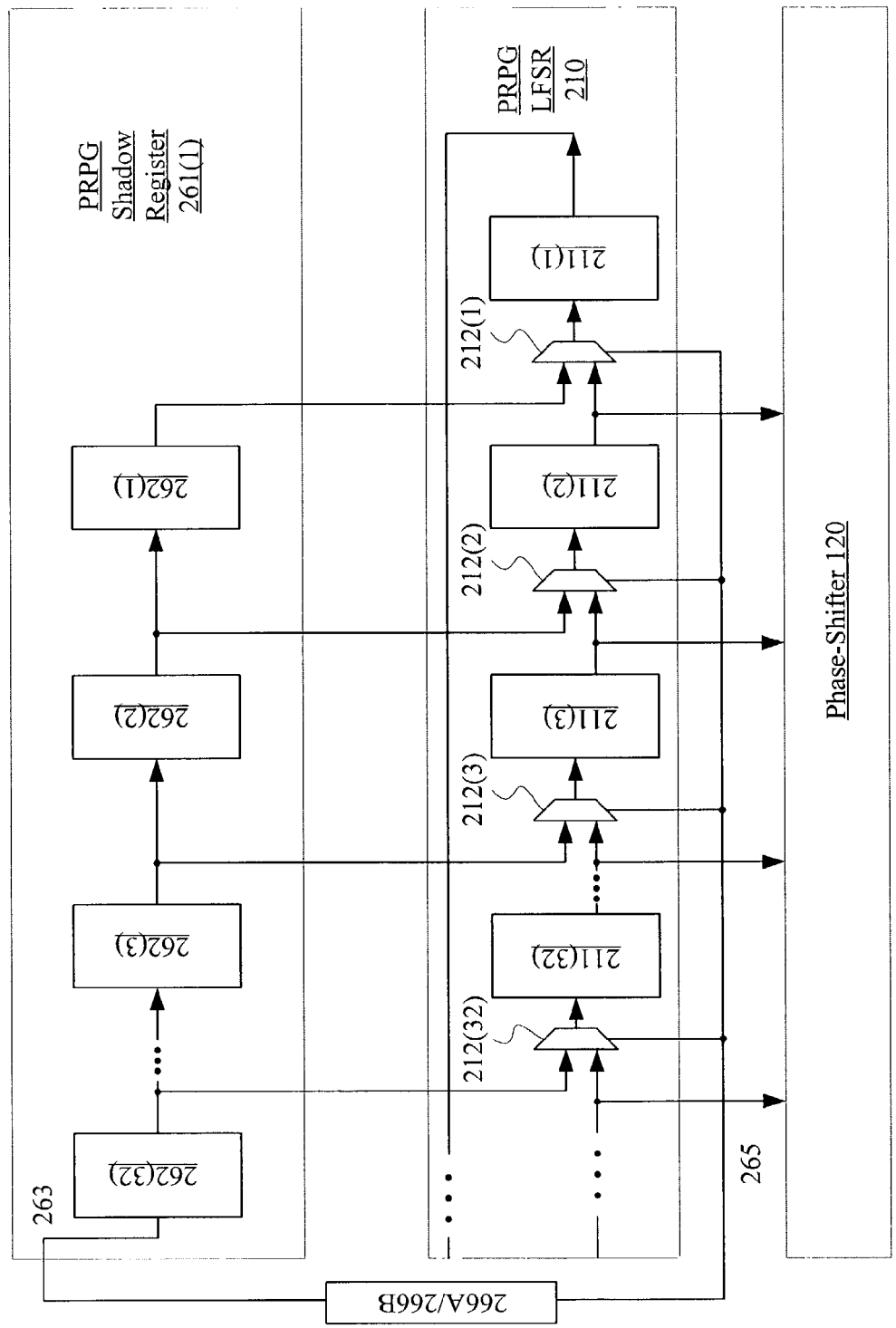
FIG. 2B illustrates one embodiment of a shadow register of the PRPG register and a portion of the PRPG-LFSR.

FIG. 2B illustrates a PRPG shadow register 261(1) and a portion of PRPG-LFSR 210 in greater detail. In the above-described embodiment, PRPG-LFSR 210 includes 256 storage elements 211. In FIG. 2B, for simplicity, only 32 storage elements (in one embodiment, flip-flops) 211 are indicated. PRPG-LFSR 210 further includes a plurality of multiplexers 212, wherein each multiplexer 212 provides an output signal to an input terminal of an associated storage element 211. Thus, 256 multiplexers 212 can be provided in one embodiment of PRPG-LFSR 210. Note that PRPG-LFSR 210 can include various feedback loops to implement desired polynomials. However, in FIG. 2B, once again for simplicity, only one feedback loop coupled to the output of storage element 211(1) is shown.

Advantageously, by using multiplexers 212, PRPG-LFSR 210 can function as a standard pseudorandom pattern generator, i.e. provide pseudorandom patterns by propagating bits in storage elements 211, or receive new seeds from PRPG shadow register 261(1). In PRPG shadow register 261(1), storage elements 262(1)–262(32) can be loaded using a scan-in line 263. These storage elements 262(1)–262(32) can then provide output signals to multiplexers 212(1)–212(32), respectively, of PRPG-LFSR 210. Note that PRPG shadow registers 261(2)–261(8) have a similar configuration to PRPG shadow register 261(1) and therefore are not explained in detail herein. PRPG shadow registers 261(1)–261(8) are referred to collectively as PRPG shadow registers 261.

A segment of a seed can be loaded into each of PRPG shadow registers 261. Thus, by loading PRPG shadow registers 261 in parallel, PRPG shadow 260 can provide a new seed to PRPG-LFSR 210 in only M clock cycles (in this embodiment, 32 clock cycles). Note that in the prior art, such as that described by B. Könemann in 1991, new seeds can be loaded in parallel. However, the re-seeding and scan chain loading are done serially. Therefore, in the preferred implementation described by Könemann including a 256 PRPG, 16 scan-in pins, and scan chains of length 300, a total of 316 scan clock cycles are necessary. In contrast, and described in further detail below, PRPG shadow registers 261, PRPG-LFSR 210, and the scan chains can be loaded in parallel, thereby dramatically reducing the overhead associated with the Könemann PRPG.

Multiplexers 212 in PRPG-LFSR 210 can be controlled by a single control signal provided on transfer line 265. In one embodiment, an external tester 266A can provide the seed segment to scan-in line 263 of PRPG shadow register 261(1) as well as the control signal to transfer line 265. In another embodiment, an on-chip controller 266B can provide the control signal to transfer line 265 and trigger a memory access to provide the appropriate seed segment to scan-in line 263. The memory could include any standard non-volatile memory cell array, thereby allowing the IC to conduct a self-test without external assistance.

The new seed that is loaded into PRPG shadow 260 can be advantageously transferred at any time to PRPG-LFSR 210. Specifically, to use a first seed for multiple patterns, the transfer of a second seed stored in PRPG shadow registers 261 into PRPG-LFSR 210 is simply delayed until the first seed has been used for the desired number of patterns. For example, assume that the clocks of storage elements 211 in PRPG-LFSR 210, storage elements 262 in PRPG shadow register 260, and the scan cells in scan chains 131–136 are pulsed at the same time. In this embodiment, the on-chip controller could include a 32-bit counter, which provides the control signal on transfer line 265 after every 32 clock cycles. In this manner, PRPG-LFSR 210 would generate 32 patterns from every seed introduced by PRPG shadow registers 261.

In other words, by using multiplexers 212, a new seed can be advantageously provided for every X patterns, wherein X is an integer greater than or equal to one. In this manner, full overlap of three seeds in different stages can be provided. Specifically, a seed i provided in PRPG-LFSR 210 can be loaded into scan chains 131–136, a seed i+1 (i.e. a subsequent seed to seed i) can be loaded into PRPG shadow 260, and captured values in scan cells sO1–sO6 generated by a seed i-1 (i.e. a previous seed to seed i) can be unloaded from scan chains 131–136. Thus, seeds i, i+1, and i−1 can all be processed simultaneously by architecture 200. A system can easily implement this fully optimized architecture with minimal silicon overhead on any integrated circuit.

Compression of Deterministic ATPG Patterns Reduces Data Storage and Test Application Time In test pattern generation, although the first few patterns detect the majority of the faults, considerably more patterns are needed to detect the remaining faults. Often, over 50% of the total number of patterns are generated to test these remaining faults. Detection of each of these remaining hard-to-detect faults could require setting a predetermined number of the scan cells (e.g. in the range of 30–60) in the scan chains to particular values, which is very unlikely to occur in random pattern generation. For this reason, it is desirable to supplement pseudorandom pattern generation with deterministic ATPG.

However, because the conditions required to test each of the hard-to-detect faults can be mutually incompatible (e.g. setting a scan cell to different logic values), a single ATPG pattern can typically only test a limited number of these faults. In fact, it is not uncommon for one ATPG pattern to be provided for only one or a few (e.g. less than 10) hard-to-detect faults. Because each prior art ATPG pattern would function as a separate seed in architecture 200, most of the bits in the seed could remain unused. For example, as noted above, a 256-bit LFSR seed can set about 240 scan cells to desired values. If an ATPG pattern generated for testing a hard-to-detect fault requires that 40 scan cells be set to specific values, then 200 bits would be left unused in the seed. Therefore, during testing of hard-to-detect faults, standard ATPG wastes many bits in the seed.

In accordance with one embodiment, these previously wasted bits can be advantageously used to satisfy the required scan cell values for additional patterns. Specifically, multiple ATPG patterns can be very tightly compressed into one seed, thereby significantly increasing the bit utilization for the seed. This feature is particularly desirable for the large number of patterns that previously could detect only a few faults each.

Note that using a large PRPG-LFSR, i.e. over 200 storage elements, ensures that faults requiring a large number of scan cells to be set can be tested. Of importance, a double compression technique, i.e. testing for multiple faults per pattern, if possible, and providing multiple patterns per seed, allows full utilization of the PRPG-LFSR.

Figure 3A:
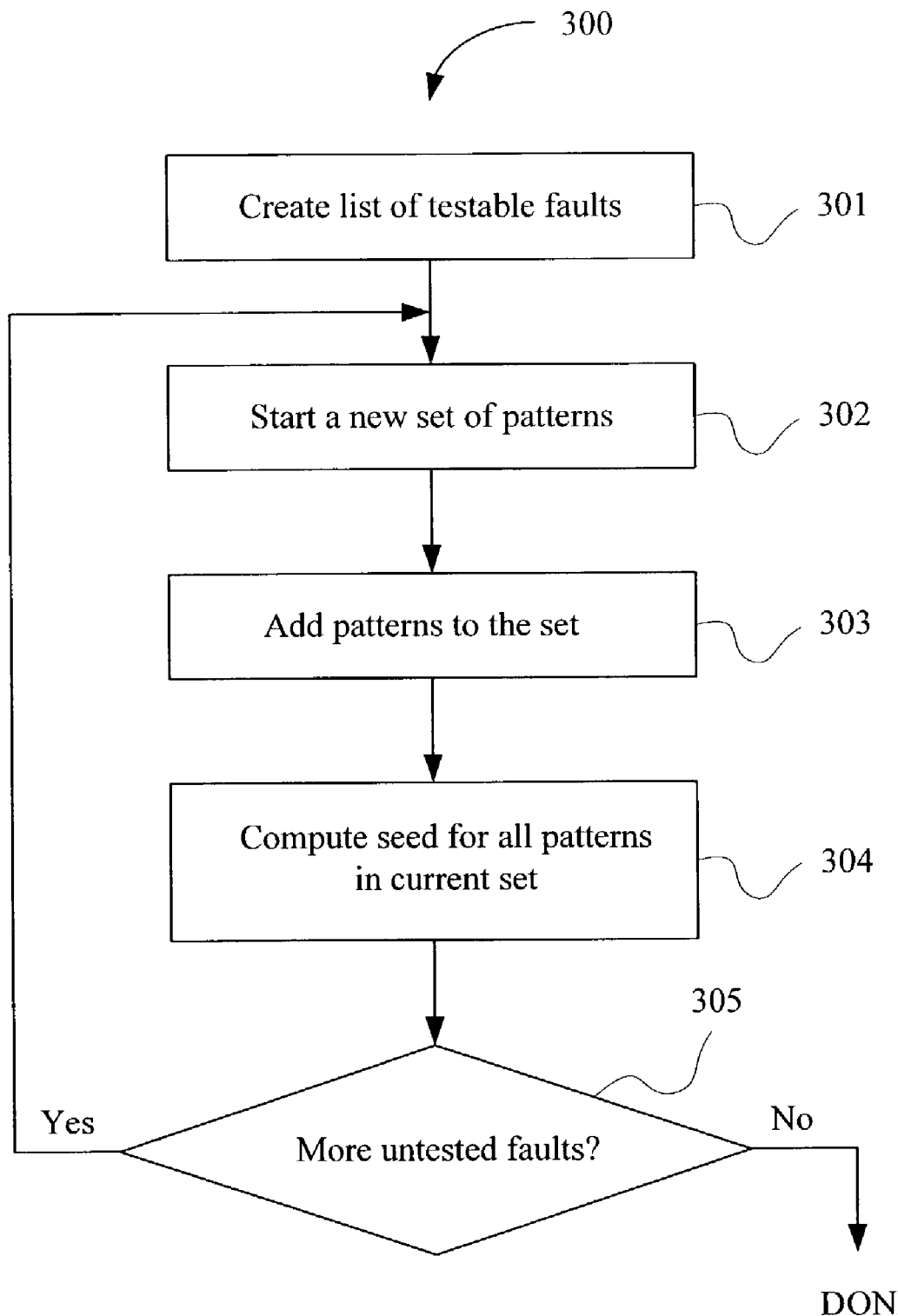
FIG. 3A illustrates a flow chart of a general test process that can be used to compute seeds for detecting faults in a design.
Figure 3B:
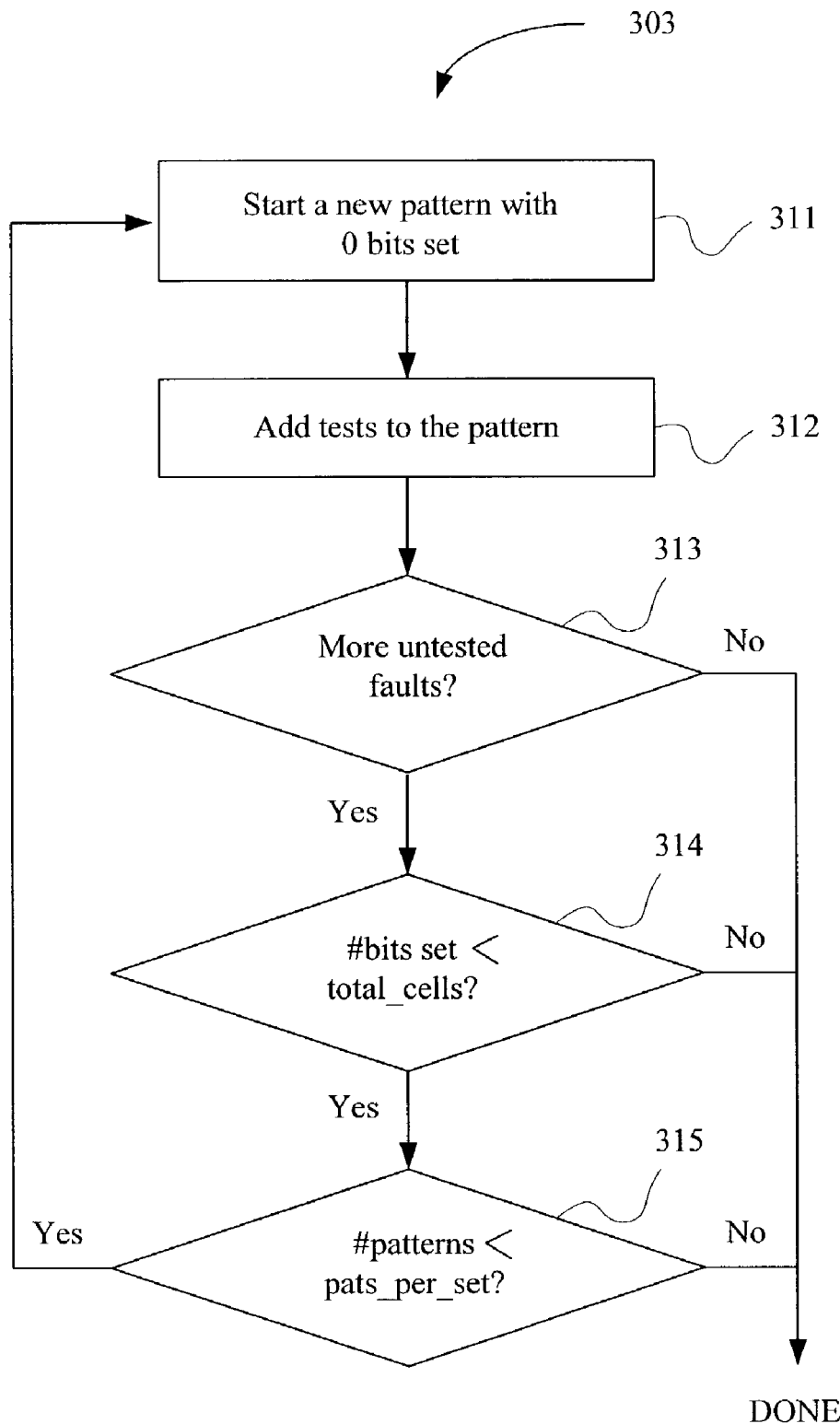
FIG. 3B illustrates a more detailed flow chart of the test process step of adding patterns to a seed.
Figure 3C:
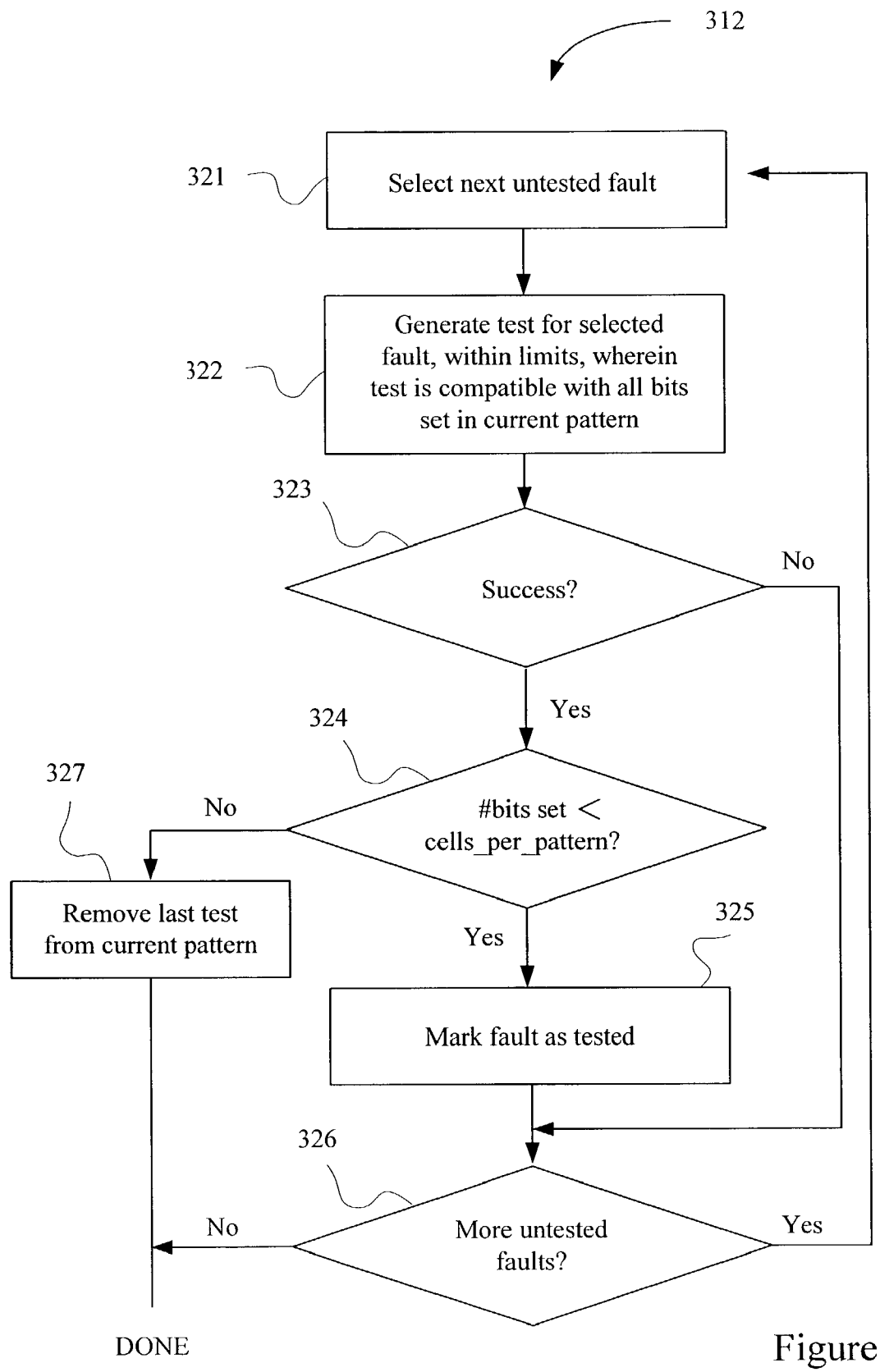
FIG. 3C illustrates a more detailed flow chart of the test process step of adding tests to a pattern.

FIGS. 3A–3C illustrate flow charts for generating a seed for multiple patterns. FIG. 3A illustrates an overview of one seed generation process 300. In step 301, a list of testable faults can be created. A new set of patterns to test these faults can be started in step 302. Patterns are added to the set in step 303 as appropriate (explained in further detail below in reference to FIGS. 3B and 3C). At this point, a seed can be computed for the patterns in the current set in step 304. Finally, if more untested faults are present, as determined in step 305, then steps 302–305 are repeated until no untested faults are left.

Note that in standard deterministic ATPG, step 304 would be eliminated. In that methodology, standard deterministic ATPG would continue to add patterns to the set until all faults are tested. Thus, as described above, deterministic ATPG results in a large number of patterns, wherein each pattern is essentially a seed. In contrast, step 304 can provide multiple patterns per seed, thereby significantly reducing the required data storage. The mathematical equations for computing multiple patterns per seed are described in detail in the section herein entitled, "Calculating a Seed for a Set of Patterns".

Referring to FIG. 3B, which describes the step of adding patterns to the set (i.e. step 303), a new pattern can be started with no care bits set in step 311. In step 312, a new test for detecting a fault can be provided to the pattern (explained in further detail in reference to FIG. 3C). If there are remaining untested faults, as determined in step 313, then step 314 can be performed to determine whether the number of care bits set is less than a maximum number of scan cells that can be set for a single seed, total_cells. In a preferred embodiment, the length of PRPG-LFSR 210 minus ten is approximately equal to total_cells. In the embodiment described above, for a 256-bit LFSR, total_cells could be set to approximately 240. If the number of care bits set is less than total_cells, then step 315 can be performed to determine if the number of patterns is less than a predetermined number of patterns per set, pats_per_set, wherein a set includes a collection of patterns for which a seed is computed. In one embodiment, pats_per_set is used during the computation of the seed. See, Equations 3 of "Calculating a Seed for a Set of Patterns". If the number of patterns is less than pats_per_set, then steps 311–315 can be repeated until either no more untested faults are found (step 313), the number of care bits set is not less than total_cells (step 314), or the number of patterns is not less than pat_per_set (step 315), at which point the step of adding patterns to the set is complete.

Referring to FIG. 3C, which describes the step of adding a test to a pattern (i.e. step 312), the next untested fault can be selected in step 321. In step 322, a test for the selected fault, within limits, can be generated, wherein the test is compatible with all the care bits set in the current pattern. Note that under certain circumstances, a test cannot be generated that is compatible with the care bits already set in the pattern. Furthermore, even if computationally possible, generating the test may prove to be too time consuming. Therefore, in some embodiments, time limitations can be included to improve system performance. Thus, in step 322, the clause "within limits" can take into account computational impossibility and/or inefficiency. Step 323 determines whether the test has been successfully generated in view of these set limitations. If it is successful, then step 324 determines whether the number of care bits in the set is less than a set number of cells in the pattern, cells_per_pattern. This limitation is less than the value of total_cells and establishes a guide for the system of the embodiments of the present invention to give up trying to place additional tests within one pattern.

Typically, cells_per_pattern can be within a range of 10%–20% less than the value of total_cells. In the embodiment for the 256-bit LFSR, cells_per_pattern can be set to approximately 200 (240−(240×0.17)). Step 324 ensures that unnecessary time is not spent on the last 10%–20% of the faults that prove to be extremely difficult to generate associated tests compatible with the care bits set in the current pattern. In this manner, the test compression operation can provide optimal performance.

If the number of care bits set is less than cells_per_pattern, then the fault is marked as tested in step 325. If more untested faults are identified in step 326, then the process returns to step 321 to select the next untested fault. If all faults are tested, then step 312 is complete.

If the test for the selected fault cannot be generated in view of the set limitations, as determined in step 323, then the process proceeds directly to step 326, which determines whether more untested faults are identified. In this manner, maximum compression can be achieved by placing as many tests with compatible care bits into one pattern. As previously noted, this compression is limited by the value of cells_per_pattern in step 324, wherein if the number of care bits set is equal to or greater than cells_per_pattern, then that test is removed from the current pattern in step 327 and step 312 is complete.

Calculating a Seed for a Set of Patterns

A seed can be computed for a set of ATPG-calculated patterns. Each pattern requires that certain scan cells be set to given values as provided by PRPG shadow 260 and PRPG-LFSR 210. Let $v_1$ be the initial state of PRPG-LFSR 210, i.e. the seed provided by PRPG shadow 260, and S be the n×n transition matrix of PRPG-LFSR 210 that implements a polynomial of degree n. The state of PRPG-LFSR 210 after k cycles can be written as:

$$v_{k+1} = v_1 S^k$$

Each of the m phase shifter outputs is a linear combination (XOR) of several PRPG-LFSR bits. The phase shifter can be described by the n×m matrix $$\Phi = [\phi_{ij}]$$

wherein $\phi_{ij}$ is 1 if input i is connected to the XOR function of output j i each column $\phi_j$ of the matrix represents an output j. Therefore, the outputs of the phase shifter (and inputs to the scan chains) after exactly k cycles can be described by the vector:

$$v\phi_{k+1} = v_{k+1}\Phi = v_1 S^k \Phi \quad \text{(Equation 1)}$$

To satisfy all pattern requirements that certain scan cells be loaded to given values $\alpha_l$, the inputs of the scan chains must satisfy the equations:

$$v_{\phi k+1} = v_{k+1}\Phi = v_1 S^k \Phi \quad \text{(Equation 2)}$$

From Equations 1 and 2, $$v_1 S^k \Phi M_{\alpha k+1} \quad \text{(Equation 3)}$$

$M_{\alpha k+1}$ contains values in each position and for each value of k that is calculated. The required bits in the plurality of scan cells of tested design 130 that are needed are filled in as 0's or 1's in their appropriate positions in $M'_{\alpha k+1}$ as shown below in Equation 3A. The other cells, which are not required, are not part of this equation and are left out.

$$v_1 S^k \Phi M'_{\alpha k+1} \text{ for } k=0 \text{ to } h-1 \quad \text{(Equation 3A)}$$

The seed $v_1$ can be computed from the subset of Equation 3, i.e. Equation 3A, considering all values of k from 0 to h−1. To compute a seed for a single pattern, h is equal to the number of shifts to load scan chains 131–136. In one embodiment, to compute a seed for pats_per_set patterns, h is the product of the number of shifts to load scan chains 131–136 and pats_per_set, wherein the system of Equations 3 is assumed to comprise all care bits in the pats_per_set_ patterns.

For large n, m, and h, creating the system of Equations 3 can be more CPU-time consuming than solving the equations. Therefore, in accordance with one embodiment, the method of the embodiments of the present invention pre-calculates and stores data that can be used later to create, with minimal computation, an alternative system of equations. At that point, Gaussian elimination can be used to solve the equations. This method is based on the observation that any seed $v_1$ is a linear combination of the basis seeds:

$$\Gamma_1 = [10 \ldots 0]$$

$$\Gamma_2 = [01 \ldots 0]$$

$$\ldots$$

$$\Gamma_n = [00 \ldots 1]$$

so that $$v_1 = \sum_{i=1}^{n} \beta_i \Gamma_i \quad \text{(Equation 4)}$$

From Equations 3 and 4, $$\sum_{i=1}^{n} \beta_i \Gamma_i S^k \Phi = \quad \text{(Equations 5)}$$

$$\sum_{i=1}^{n} \beta_i (\Gamma_1 S^k \Phi) = \sum_{i=1}^{n} \beta_i M_{i k+1} = M_{\alpha k+1} \text{ for } k = 0\ldots h-1$$

wherein $M_{ik+1}$ is the k+1 row of the matrix $M_i$, and $M_{\alpha k+1}$ is the same as used in Equations 3 and 3A above. The h×m matrices $M_i$ are computed as follows: the PRPG-LFSR 210 is initialized with the basis seeds Γi, one at a time, and the end values loaded into scan chains 131–136 for each of the pats_per_set patterns are computed and stored. The pats_per_set bits are stored for each basis seed and for each scan cell. This pre-computation is done prior to the pattern set generation algorithm of FIGS. 3A–3C.

To compute a seed for the pattern set calculated in FIGS. 3A–3C, the pre-computed $M_i$ values are used to immediately create the system of Equations 5. These Equations 5 are much simpler than Equations 3A and are quickly solved through Gaussian elimination for $\beta_i$. But $\beta_i$ are exactly the coefficients of the desired seed $v_1$, as follows from Equation 4. Thus, seed computation in accordance with the embodiments of the present invention is very efficient and requires an insignificant amount of time in the flow of FIGS. 3A–3C.

Illustrative Implementations

In accordance with one embodiment, PRPG shadow 260, PRPG-LFSR 210, phase-shifter 120, compactor 140, and MISR-LFSR 150 can be implemented as a single library element (e.g. the BIST controller library element). In another embodiment, this library element could also include the on-chip controller for providing the control signal to PRPG-LFSR 210 and the memory access for loading seeds into PRPG shadow 260. In yet another embodiment, PRPG shadow 260, PRPG-LFSR 210, phase-shifter 120, compactor 140, and MISR-LFSR 150 can be implemented as separate library elements. In these embodiments, the library element(s) can be selected during the design process similar to any standard library element. In yet another embodiment, the design could be submitted to a third party, wherein the third party could build PRPG shadow 260, PRPG-LFSR 210, phase-shifter 120, compactor 140, and MISR-LFSR 150 out of standard library elements based on the submitted design.

Note that if the integrated circuit is a programmable logic device (PLD), then the BIST controller could be implemented using standard programmable resources on the PLD. Alternatively, in a PLD, the BIST controller could be implemented as a core (i.e. intellectual property (IP)), wherein the core could include a predetermined set of configuration bits that program the PLD to perform one or more functions. In another embodiment, a core could include source code or schematics, which describe the logic and connectivity of a design. Cores can be provided with an optimally floorplanned layout for specific PLDs. Cores can also be parameterizable, i.e. allowing the user to enter parameters to activate or change certain core functionality. Also note that the BIST controller, or any of its constituent parts, could be implemented in hard logic on the integrated circuit.

The methods described herein can be implemented using software, wherein the software can be stored on any type of appropriate media including a computer hard disk drive, a CDROM, or a server. In one embodiment, a computer running a set of instructions can interface with standard IC design software to ensure that test and pattern compression is optimized. In the computer-implemented embodiment, the software of the embodiments of the present invention can be run on a variety of computer platforms including: a PC using Windows 2000™ or NT™, 4.0 operating system with 128 MB of RAM and a 200 MHz Pentium Pro™ microprocessor, either stand alone or connected to a network, and a SUN™ workstation computer among others.

DBIST Provides Optimal Fault Coverage and Test Application Time

Providing deterministic ATPG patterns to the logic BIST structure of the invention (DBIST) significantly reduces test application time compared to both standard BIST systems and standard deterministic ATPG system. Specifically, as previously described above, loading seeds into a standard BIST system would require loading the PRPG in a serial manner. By using the PRPG shadow having multiple registers that load in parallel, the number of clock cycles can be dramatically reduced. For example, in the embodiments described herein, the standard BIST system would take 256 clock cycles, in addition to the 32 clock cycles required for loading the scan chains of the design, thereby resulting in a 256 clock cycle overhead. In contrast, the PRPG shadow would only take 32 clock cycles, which are fully overlapped with the 32 clock cycles required for loading the scan chains of the design, thereby resulting in no clock cycles overhead. Therefore, providing deterministic ATPG patterns to the logic BIST structure of the invention clearly reduces test application time compared to standard BIST systems.

In standard deterministic ATPG, because the test patterns are provided directly to the scan input pins and read from the scan output pins, this method can be severely limited by the number of pins provided for the IC. Specifically, to minimize test application time, the deterministic ATPG patterns are typically provided simultaneously to the scan input pins. Therefore, in light of the limited number of total pins available on the IC (e.g. 100 scan input and 100 scan output pins) and the desirability of placing all state elements in a scan chain, the resulting scan chains provided on the IC are relatively long.

Figure 4A:
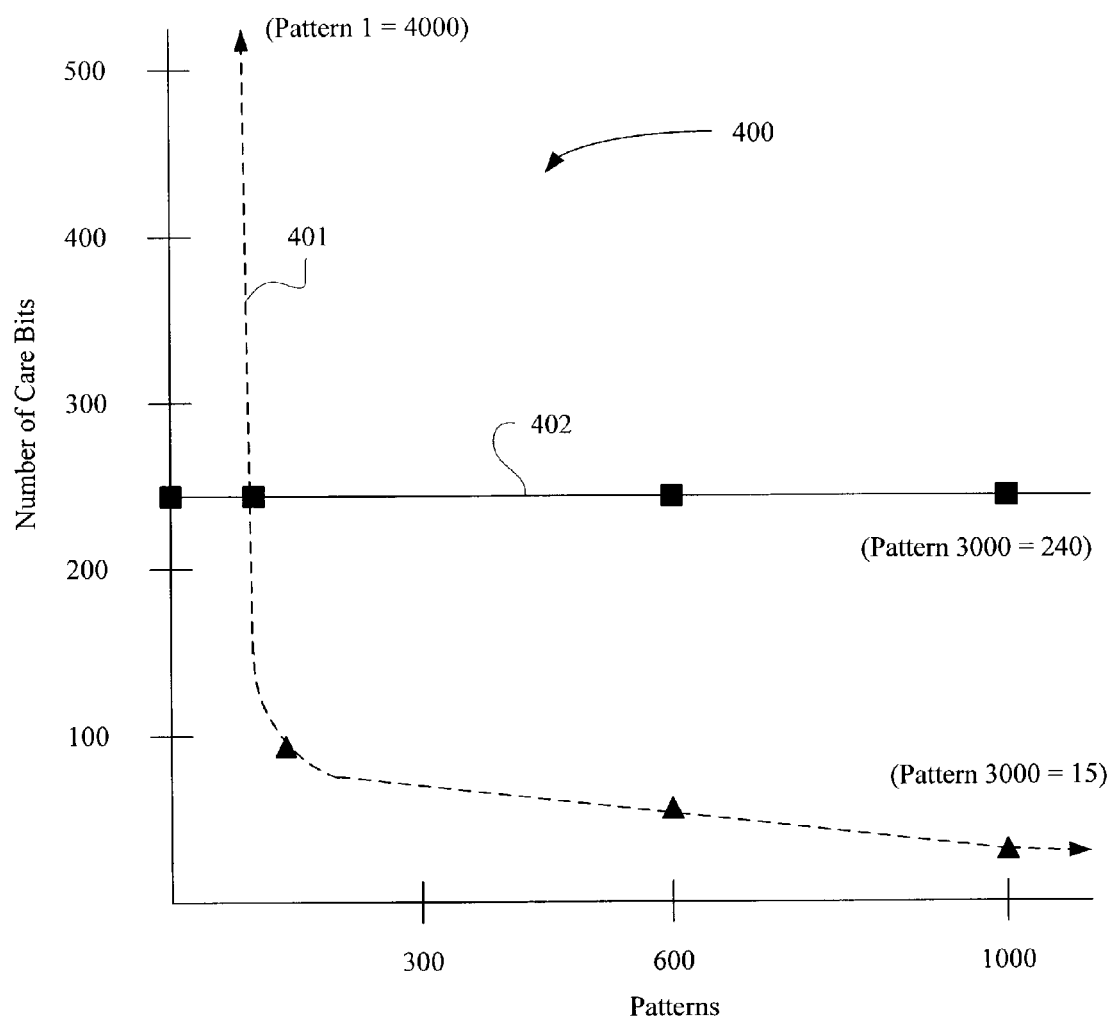
FIG. 4A illustrates a graph comparing the fault targeting efficiency of deterministic ATPG and deterministic BIST.

FIG. 4A illustrates a graph 400 plotting the number of care bits versus patterns. In graph 400, the dashed curve 401 represents the number of care bits that can be provided for each pattern using deterministic ATPG, whereas the solid line 402 represents the number of care bits that can be provided by the invention. Note that although the specific values can vary somewhat depending on the actual IC design or other factors, an analysis of various standard IC designs should yield comparable results to those shown in FIG. 4A.

As known by those skilled in the art, deterministic ATPG is extremely efficient at utilizing care bits while targeting faults in its initial test patterns. For example, a first pattern might utilize up to 4000 care bits. However, after a relatively few number of patterns, the number of care bits that can be utilized is reduced dramatically. Thus, pattern 100 might only be able to utilize 60 care bits and pattern 600 might only be able to utilize 30 care bits. This progressively less efficient method can continue up to the last pattern, e.g. pattern 3000, which might utilize only 15 care bits.

In contrast, as indicated by step 324 in FIG. 3C, a relatively constant number of care bits for every seed can be utilized. In the embodiments described herein, up to approximately 240 care bits can be utilized assuming a 256-bit PRPG is provided. Thus, at some pattern close to pattern 100, more care bits can be utilized than standard deterministic ATPG. In fact, this number of care bits can be utilized up to the last seed.

of interest, the number of patterns needed might be increased by a factor of two compared to standard deterministic ATPG. In other words, 6000 patterns would be used instead of 3000. However, because at least two patterns are placed in every seed, FIG. 4A is perhaps best appreciated by recognizing that line 402 can represent care bits utilized per seed of the invention.

Moreover, the deterministic BIST structure, i.e. including the PRPG and PRPG shadow, advantageously allows the design under test to be divided into many more scan chains compared to deterministic ATPG, e.g. 512 scan chains compared to 100 for deterministic ATPG. In other words, a scan chain in a deterministic BIST architecture could be five times shorter than a scan chain used in deterministic ATPG. Therefore, using the deterministic BIST architecture, the number of patterns might be increased by a factor of two, but every pattern can be applied in five times fewer clock cycles. Hence, the test application time can be reduced by a factor of two compared to deterministic ATPG.

Thus, in summary, deterministic BIST architecture can provide fault coverage approaching 100% while significantly reducing the test application time compared to both logic BIST and deterministic ATPG.

Filtering Bits from Scan Chains Eliminates Uncertain Outputs

Based on the seed provided to the PRPG shadow, the PRPG LFSR and phase-shifter generate predetermined bit sequences, i.e. the test patterns, for the scan chains of the tested design. The output bits of the scan chains include both Fault bits, i.e. those bits that can indicate faults in the tested design, as well as "Don't Care" bits, i.e. those bits that do not indicate faults in the tested design. These Fault bits and Don't Care bits are provided to the MISR LFSR (via the compactor) for processing. The state of the MISR LFSR can be compared to the known "signature" of the fault-free design, wherein a mismatch indicates that at least one erroneous value was unloaded from the scan chains. This erroneous value can be used to determine that a fault exists in the tested design and where that specific fault is located.

Figure 4B:
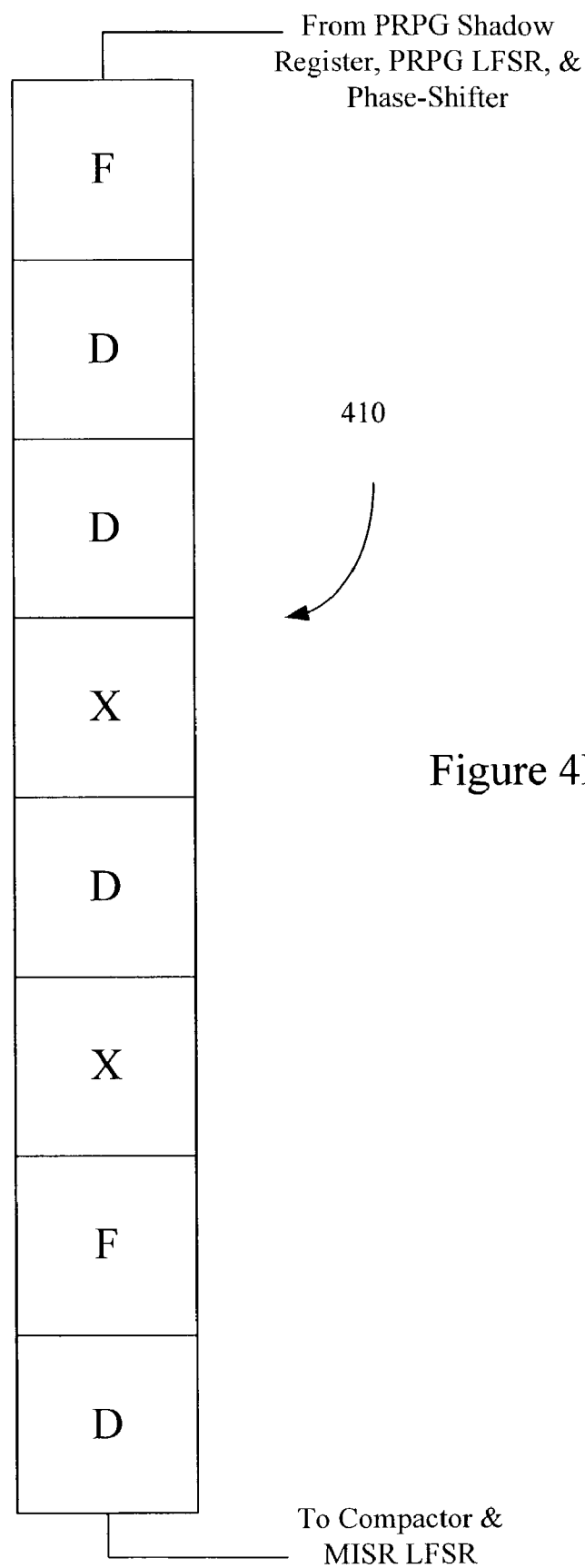
FIG. 4B illustrates a scan chain including fault, don't care, and uncertain bits.

However, the tested design can occasionally output Uncertain bits in addition to Fault bits and Don't Care bits. These Uncertain bits have values that are unknown, and thus can corrupt the signature generated by the MISR LFSR. FIG. 4B illustrates a scan chain 410 having a plurality of bits (generated by a seed provided to the PRPG shadow and processed by the PRPG LFSR and phase-shifter). Scan chain 410 includes 8 bits, in which 2 bits are Fault (F) bits, 4 bits are Don't Care (D) bits, and 2 bits are Uncertain (X) bits.

In one embodiment, the design-for-test (DFT) can be changed to eliminate these Uncertain bits. However, this solution has the disadvantage of potentially increasing silicon area to provide the necessary test generation. Moreover, changing the DFT can also adversely affect the timing of the design-under-test (DUT). Finally, because some Uncertain bits can be discovered after wafer production begins, changing the DFT would necessitate re-fabricating the silicon, thereby resulting in increased manufacturing cost and potentially jeopardizing a product's time to market. Therefore, a solution other than changing DFT is highly desirable.

In another embodiment, a filter can be used to mask these Uncertain bits before these bits are provided to the MISR LFSR (via the compactor). Embodiments of this filter are described in U.S. patent application Ser. No. 10/117,747, now U.S. Pat. No. 6,993,694, entitled "Deterministic BIST Architecture Including MISR Filter", filed on Apr. 5, 2002, assigned to Synopsys, Inc., and incorporated by reference herein. Filtering can efficiently mask a limited number of Uncertain bits. However, to ensure that the number of Uncertain bits is limited, the user must design out as many Uncertain bits as possible using DFT.

If this design modification is unsuccessful, masking a large number of Uncertain bits can result in the tester's inability to observe Fault bits. In other words, even one Uncertain bit provided to the MISR can invalidate that test pattern.

Specifically, the MISR provides its signature by performing various functions on its bits. Therefore, an Uncertain bit can quickly taint other bits in the MISR, thereby invalidating any signature subsequent to receipt of the Uncertain bit.

Therefore, an Uncertain bit can quickly taint other bits in the MISR, thereby invalidating any signature subsequent to receipt of the Uncertain bit.

Therefore, in yet another embodiment, the MISR filter can be eliminated and the outputs of the scan chains can be observed and interpreted by the tester. In this embodiment, the tester can address Uncertain bits in the same manner that the tester addresses Don't Care bits, i.e. they are ignored. In this manner, the Uncertain bits have no corrupting impact on interpretation of the scan chain outputs.

Note that this configuration, like ATPG, can result in considerable data output volume. Therefore, in accordance with one feature of the invention, output data volume can be decreased by selectively providing a limited number of scan chain outputs. These scan chain outputs can be chosen to optimize the number of observable Care bits.

XDBIST Architecture Overview

Figure 5A:
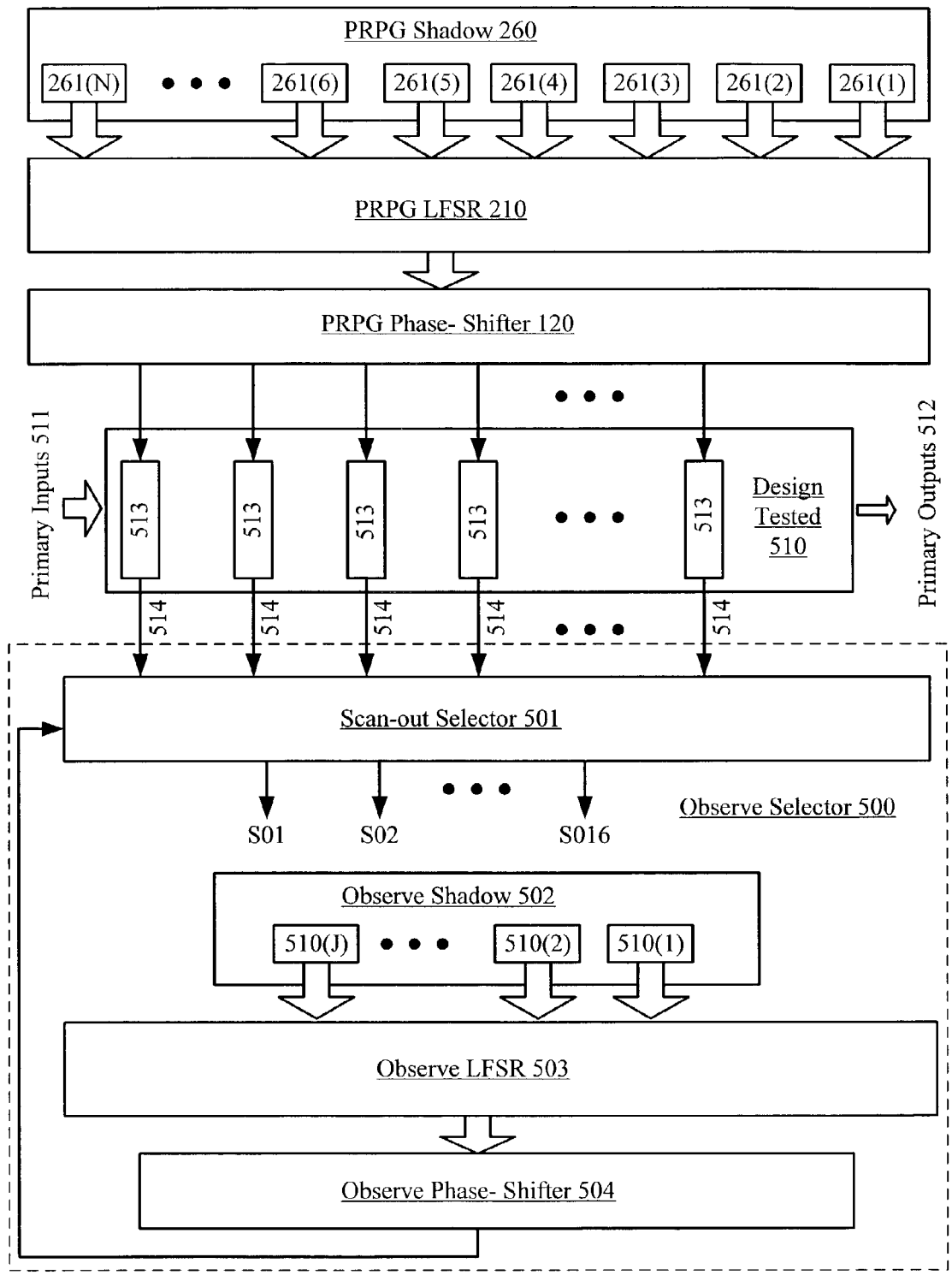
FIG. 5A illustrates one embodiment of a DBIST architecture tolerant of uncertain (X) bits (i.e. an XDBIST architecture).

FIG. 5A illustrates one embodiment of an X-tolerant DBIST (XDBIST) architecture. In this embodiment, as described above with respect to a DBIST architecture, scan-in data input volume can be significantly reduced by compressing deterministic ATPG patterns into LFSR seeds so that all Care bits are set to desired values, whereas all other scan cells can be set to pseudo-random values from the LFSR. Moreover, the number of test application cycles can be reduced by including PRPG shadow 260, PRPG LFSR 210, and PRPG phase-shifter 120 to the input side of the scan chains, thereby allowing re-seeding with 0-cycle overhead.

Advantageously, the XDBIST architecture can significantly reduce DFT. Specifically, in a DBIST architecture, primary inputs and primary outputs in the tested design are included as scan cells in the scan chains (called the "wrapping" of I/Os). In this manner, the X/DBIST PRPG (i.e. collectively PRPG shadow 260, PRPG LFSR 210, and PRPG phase-shifter 120, wherein X/DBIST refers to structures that can be provided in both DBIST and XDBIST architectures) can control all I/Os. This control is not necessary in the XDBIST architecture. Thus, as shown in FIG. 5A, primary inputs 511 flow into and primary outputs 512 flow out from tested design 510. Note that tested design 510 further receives scan inputs from PRPG phase-shifter 120. In other words, logic provided in tested design 510 can be connected to both scan chains 513 as well as primary inputs 511 and primary outputs 512.

In this configuration, a tester can provide stimuli to primary inputs 511 as well as use PRPG shadow 260, PRPG LFSR 210, and PRPG phase-shifter 120 to provide scan inputs to scan chains 513. In accordance with one feature of the invention, the tester can directly measure primary outputs 512 as well as selected outputs of scan chains 513, i.e. signals provided on scan output pins. S01–S016. (Note that providing stimulus to primary inputs and measuring primary outputs is well known in the art of deterministic ATPG, and is described in various sources, including, for example, "Digital Systems Testing and Testable Design," M. Abramovici, M. A. Breuer, and A. D. Friedman, IEEE Press, 1990 as well as "Structured Logic Testing," E. B. Eichelberger, E Lindbloom, J. A. Waicukauski, and T. W. Williams, Prentice-Hall, 1991, both of which are incorporated by reference herein.) Thus, in an XDBIST architecture, DFT can be used to connect scan chains 513 without interfering with primary inputs 511 or primary outputs 512. In this manner, compared to DBIST and its associated wrapping of the I/Os, DFT in XDBIST can be significantly simplified.

Observe selector 500 works on a similar principle to that of the X/DBIST PRPG. Specifically, although hundreds of thousands or even millions of scan cells are loaded, the X/DBIST PRPG can efficiently focus its efforts at controlling a limited number of Care bits. Similarly, although hundreds of scan chains can generate scan outputs, observe selector 500 can efficiently transfer a limited number of these scan outputs to the tester, thereby optimizing use of the tester. In other words, to test a fault, multiple Care bits may need to be set. However, only one output needs to be observed. For example, to test an N-input AND gate, N inputs need to be set. In contrast, only one signal of the AND gate, i.e. its output, needs to be observed.

In FIG. 5A, observe selector 500 comprises a scan-out selector 501, an observe shadow 502, an observe LFSR 503, and an observe phase-shifter 504. Observe shadow 502, which can include J registers having a total length the same as observe LFSR 503, can load its J registers in parallel. In one embodiment, observe shadow 502 and observe LFSR 503 can be structurally identical to PRPG shadow 260 and PRPG LFSR 210 (i.e. N=J), thereby allowing these devices to use the same design and thus operate concurrently. In other words, observe shadow 502 could load its "observe" seed for pattern i+1 at the same time that PRPG shadow 260 loads its seed for pattern i+1. Observe phase shifter 504, which could be identical in size to or smaller than PRPG phase shifter 120, provides control signals to a scan-out selector 501. In turn, scan-out selector 501 outputs selected scan chain outputs to scan output pins S01–S016.

In another embodiment, observe shadow 502 could be smaller than PRPG shadow 260. For example, PRPG shadow 260 could have 12 registers (N=12), each register having 40 bits, whereas observe shadow 502 could have 4 registers (J=4), each register also having 40 bits. In that embodiment, PRPG LFSR 210 and observe LFSR 503 could be sized to conform to PRPG shadow 260 and observe shadow 502, respectively.

In the embodiments described in reference to FIG. 5A, observe selector 500 can select specific scan cells for observation by using observe LFSR 503 and observe phase-shifter 504. In other words, the control signals provided by observe phase-shifter 504 to scan-out selector 501 can change as the seed for observe LFSR 503 is loaded.

Note that there can be hundreds of primary inputs and primary outputs, which can be accessed in parallel in one cycle. In contrast, there can be millions of scan cells, which are accessed serially through loads and unloads of scan chains. This loading and unloading can take hundreds or thousands of cycles. Therefore, a tester spends a majority of its time controlling scan inputs and observing scan outputs. The XDBIST architecture advantageously affects what a tester "sees". For example, a standard deterministic ATPG could include 16 scan chains, each scan chain including 1280 scan cells. In accordance with one feature of the invention, the number of "external" scan chains (i.e. those scan chains visible to the tester) can be retained while significantly increasing the number of "internal" scan chains (i.e. those scan chains not visible to the tester).

For example, in one embodiment, the XDBIST architecture can include 16 external scan chains, but 512 internal scan chains, each scan chain including 40 scan cells. Of importance, the decompression and compression provided respectively by the XDBIST PRPG and observe selector 500 allow the effective use of these internal scan chains. Using the XDBIST architecture, the tester "sees" only 16 scan chains, each scan chain including only 40 scan cells. Therefore, compared to the example deterministic ATPG configuration, the XDBIST architecture has effectively reduced the size of the design by a factor of 32. In this manner, a tester can apply test vectors to an XDBIST architecture faster than for a deterministic ATPG architecture.

In light of the difference between the number of external scan chains and the number of internal scan chains, the goal of observe selector 500 is to select the scan chains 513 that detect as many faults as possible from a fault list. Specifically, the test generator can determine the values of primary inputs 511 as well as the scan cells that need to be controlled and, as a result, what scan cells need to be observed in tested design 510. The tester can then load an appropriate seed into observe shadow 502 to ensure that the values of the designated scan cells are provided to scan-out selector 501.

Of importance, the test generator can also compute when these scan outputs are provided to scan-out selector 501 and which scan chains 513 provide what scan outputs. After this computation, using a system of linear equations, the test generation program can generate additional "observe" seeds for observe shadow 502, which can be loaded into registers 510(1)–510(J) in parallel. These observe seeds will determine which 16 outputs of the 512 scan chains 513 will be provided by scan-out selector 501 during each cycle to scan output pins SO1–SO16.

Figure 5B:
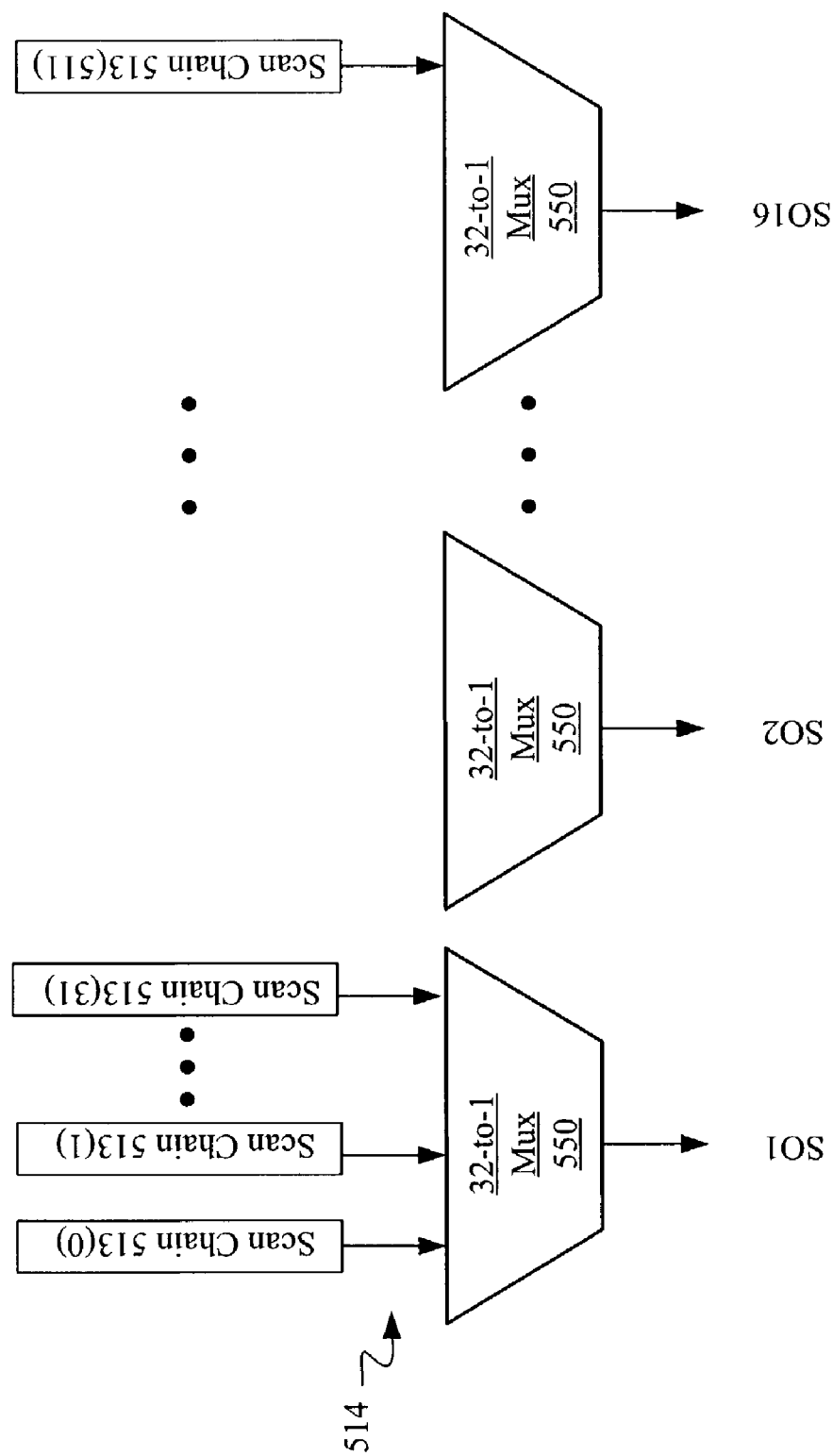
FIG. 5B illustrates one embodiment for the scan-out selector shown in FIG. 5A.

To provide this selection function in observe selector 500, scanout selector 501 could include 16 multiplexors, as shown in FIG. 5B, each multiplexer 550 providing a signal to one of scan output pins SO1–SO16. To ensure that the value of a given scan cell is observed, a multiplexor 550 must select the appropriate scan chain during the cycle when the value of that scan cell has been shifted down to the output of scan chain 513.

In this embodiment including 512 internal scan chains and 16 scan output pins, each multiplexor 550 could receive a fixed set of 32 scan chain outputs 514 and select one of those 32 scan chain outputs. However, when observing a value from one scan chain, the values of the other 31 scan chains received by the same multiplexor cannot be observed in the same cycle. Therefore, some cells targeted for observation in a pattern might not be able to be scanned out. This "bottleneck" may result in a pattern detecting fewer faults than expected by the test generator, thereby increasing the total number of patterns required to achieve the same test coverage.

Figure 5C:
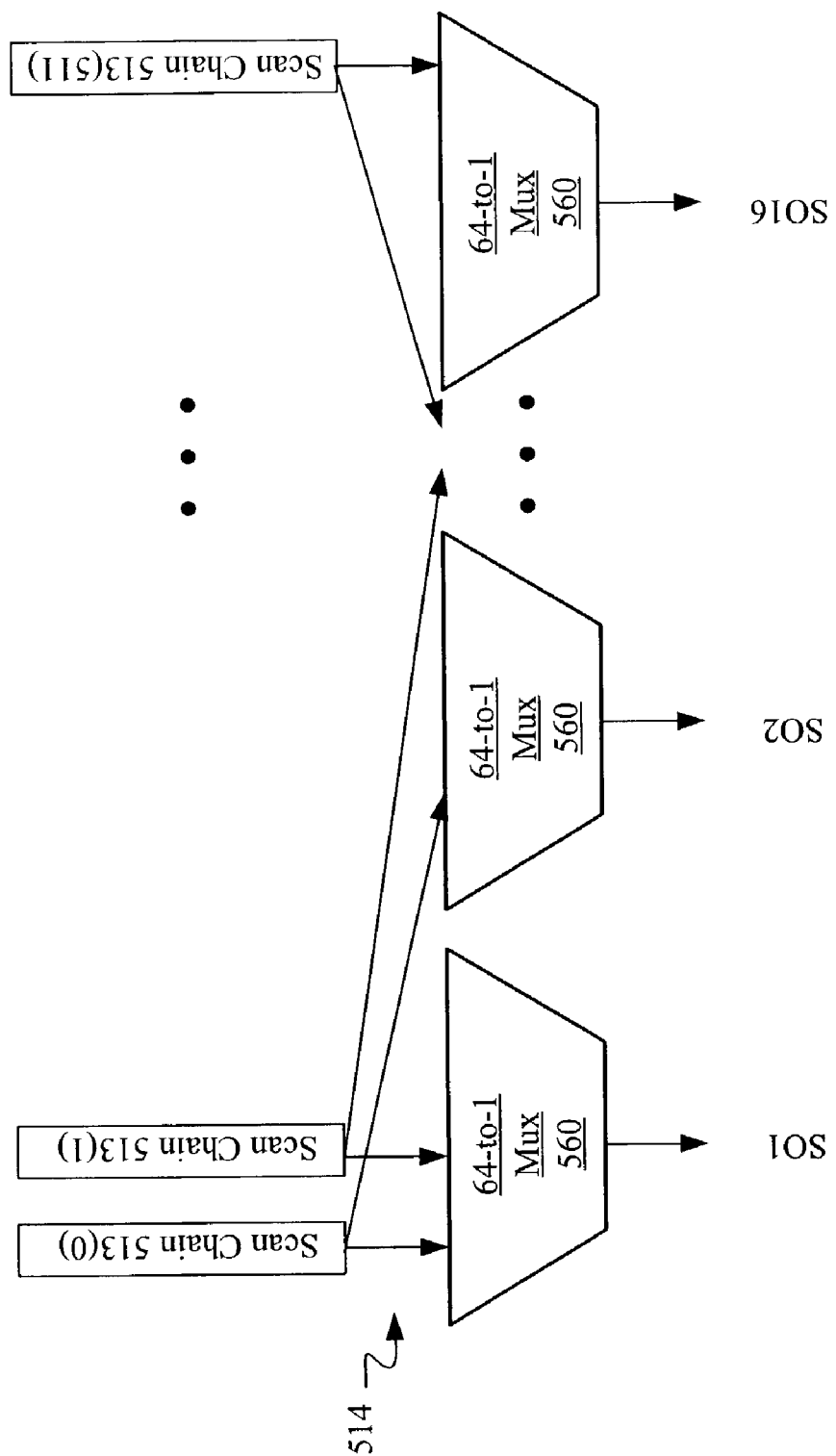
FIG. 5C illustrates another embodiment for the scan-out selector shown in FIG. 5A.

In one embodiment, to increase the probability that multiple scan cells in a pattern can be observed, scanout selector 501 can be designed so that every scan chain output 514 is connected to more than one multiplexer, as shown in FIG. 5C, thereby increasing the probability that an arbitrary selection of scan cells can be observed in the same cycle. For example, each multiplexer 560 could receive 64 scan chain outputs. In this configuration, observe phase shifter 504 would provide scan-out selector 501 with 96 control signals (i.e. 6 control signals for each of the 16 multiplexors 560).

As described above, using a 256-bit PRPG LFSR 210 ensures that about 240 scan cells can be set to desired values for each pattern. Compared to deterministic ATPG patterns, this limitation increases the number of DBIST patterns that can control every scan cell. In one XDBIST embodiment, observe LFSR 503 can be structurally identical to PRPG LFSR 210 (i.e. 256-bits long), thereby ensuring that 40 (i.e. 240 scan cells/6 control signals) scan cells can be selected for observation in every pattern. Note that each pattern can observe $1/32$ (i.e. $16/512$) of all scan cells, including the 40 scan cells specifically targeted for observation. Because there can be thousands or even tens of thousands of scan cells, the number of randomly observed scan cells can be significant. In other words, the fault simulator can exploit fortuitous fault detection.

The data volume reduction achieved by observe selector 500 (compared to the full data volume provided by deterministic ATPG) is partially offset by a 2× to 3× increase in the total number of patterns used for XDBIST compared to the number used for deterministic ATPG. Therefore, the overall data volume reduction achieved by the XDBIST embodiment shown in FIG. 5 is approximately a factor of 10.

Note that the number of cycles per load (which can be determined by the length of the scan chains (wherein, in contrast, the number of cycles per pattern can be determined by the length of the scan chains plus the number of capture cycles for the pattern)) is reduced by a factor of 32 (i.e. $512/16$) assuming there are 16 chains in the deterministic ATPG architecture and 512 internal chains for the XDBIST architecture. However, once again, the 2× to 3× increase in the number of XDBIST patterns partially offsets this gain. Therefore, the overall cycles reduction of XDBIST compared to deterministic ATPG is approximately a factor of 10. Note that increasing the number of internal chains can further decrease the number of cycles required to apply all XDBIST patterns.

Figure 5D:
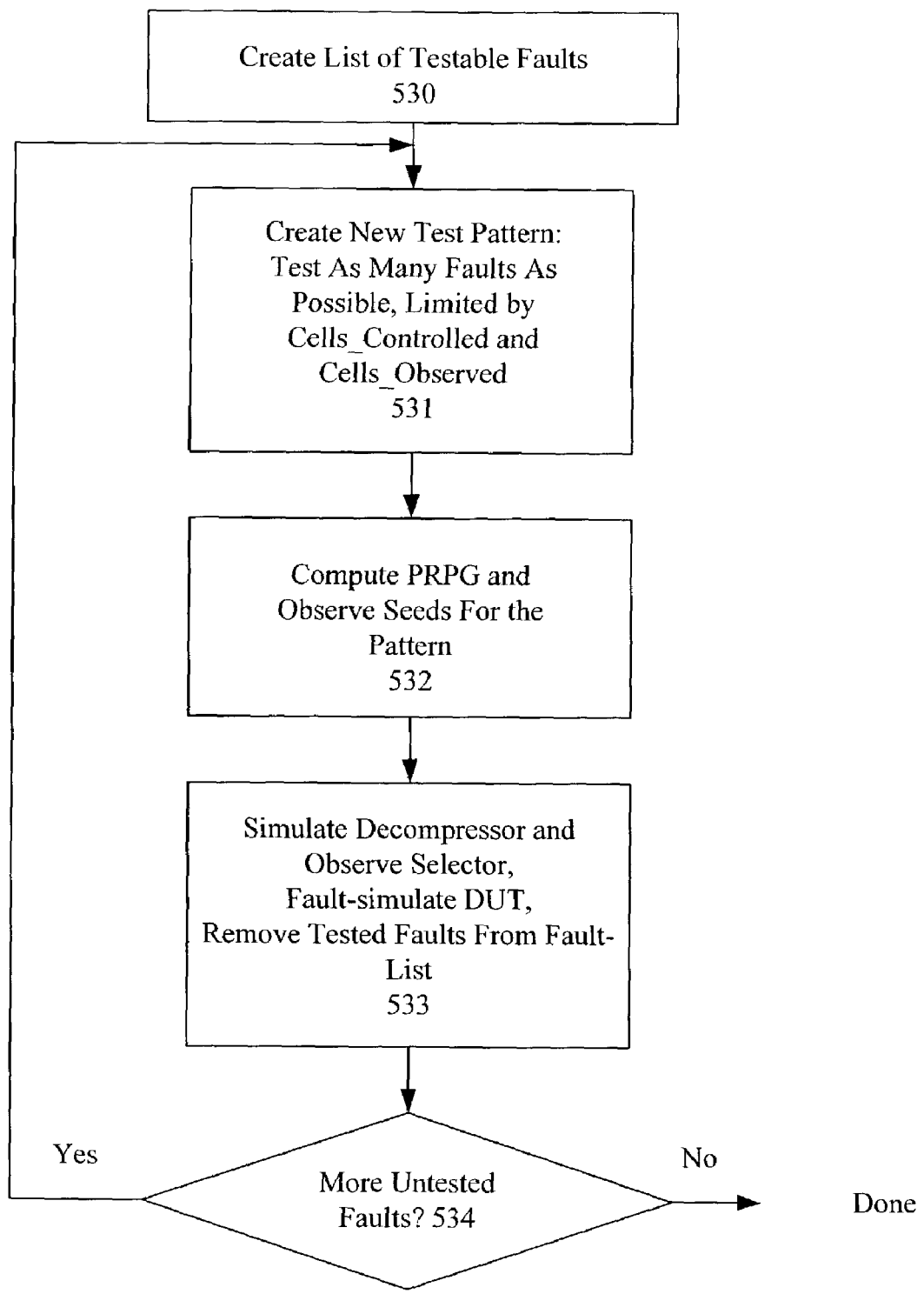
FIG. 5D illustrates an exemplary test pattern generation algorithm for the XDBIST architecture of FIG. 5A.

FIG. 5D illustrates an exemplary test pattern generation algorithm for the XDBIST architecture of FIG. 5A. Specifically, in step 530, a list of testable faults can be created. Using this list, new test patterns can be created in step 531. These tests can target as many faults as possible in a single pattern, but at the same time limit the number of controlled scan cells to a first limit (i.e. cells_controlled) and the number of observed scan cells to a second limit (i.e. cells_observed). In one embodiment, setting cells_controlled to about 240 (for a 256-bit PRPG LFSR 210) and cells_observed to about 40 (for a 256-bit observe LFSR 503) ensures a very high probability that the two seeds exist to satisfy the desired control and observe values (explained in further detail in reference to FIG. 9).

In step 532, seeds for PRPG LFSR 210 and observe LFSR 503 can be computed by solving a system of linear equations derived using pre-computed LFSR and phase-shift data. Note that less data needs to be computed and stored if (1) PRPG LFSR 210 and observe LFSR 503 are structurally identical and (2) observe phase shifter 504 contains a subset of the outputs of PRPG phase shifter 120. In step 533, the fault simulator of the test generator can simulate PRPG phase shifter 120 and observe selector 500 to determine which scan cells are controlled and observed for each pattern. This information can be used to remove the tested faults from a fault list. Step 534 determines whether more untested faults are still present. If so, the process returns to step 531. Otherwise, the process is done.

Figure 6:
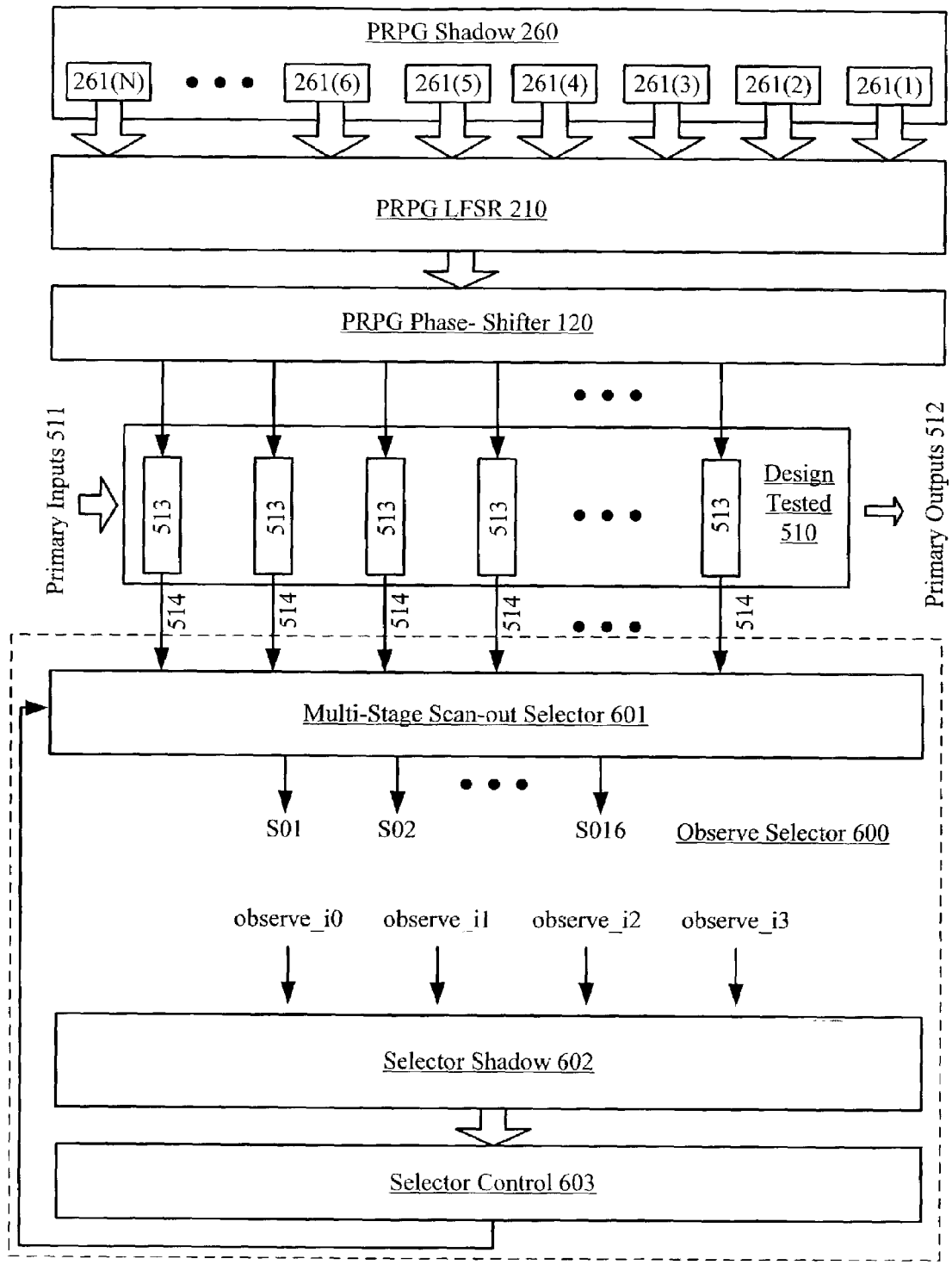
FIG. 6 illustrates another exemplary XDBIST architecture including an observe selector that can fix its selection of scan chains for all shift cycles of a pattern.

FIG. 6 illustrates another exemplary XDBIST architecture including an observe selector 600. In this embodiment, a multi-stage scan-out selector 601 in observe selector performs substantially the same function as scanout selector 501, i.e. select 16 out of 512 scan chains for observation. However, in multi-stage scan-out selector 601, this selection is fixed for all shift cycles of a pattern. In other words, the control signals provided by a selector control 603 to multi-stage scan-out selector 601 do not change as the seed for selector shadow 602 is being loaded. Thus, specific chains can be selected for the duration of the pattern unload.

Scan chain selection can be particularly advantageous in designs with multiple clocks. Specifically, in designs that have a large number of functional clocks that cannot be pulsed in the same pattern, scan chains can be created from groups of scan cells that share the same clock. In this manner, scan chains having different clocks can be connected to the same multiplexor. However, to better account for these different clocks, a fixed set of 16 scan chains can be used for the duration of the current pattern unload instead of varying the multiplexer selection every cycle. Note that in this embodiment, partitioning scan cells into scan chains is preferably done prior to any testability analysis.

Typically, a fault can propagate to many scan cells that often are part of the same scan chain. Therefore, to detect that fault, at least one of those scan cells must be observed. When selecting individual cells for observation using selector 501 (FIG. 5A), there is a high probability that at least one of the cells the fault effect propagates to can be observed. However, when selecting entire scan chains for observation in a pattern as in multi-stage scan-out selector 601, faults may be unobservable because needed scan chains cannot be observed. As a result, additional patterns may be required to test all faults, thereby increasing both data and cycle count of the XDBIST test. Therefore, a design of scanout selector 601 that maximizes the probability of observing any desired subset of scan chains is critical to the efficiency of this XDBIST architecture.

Figure 7A:
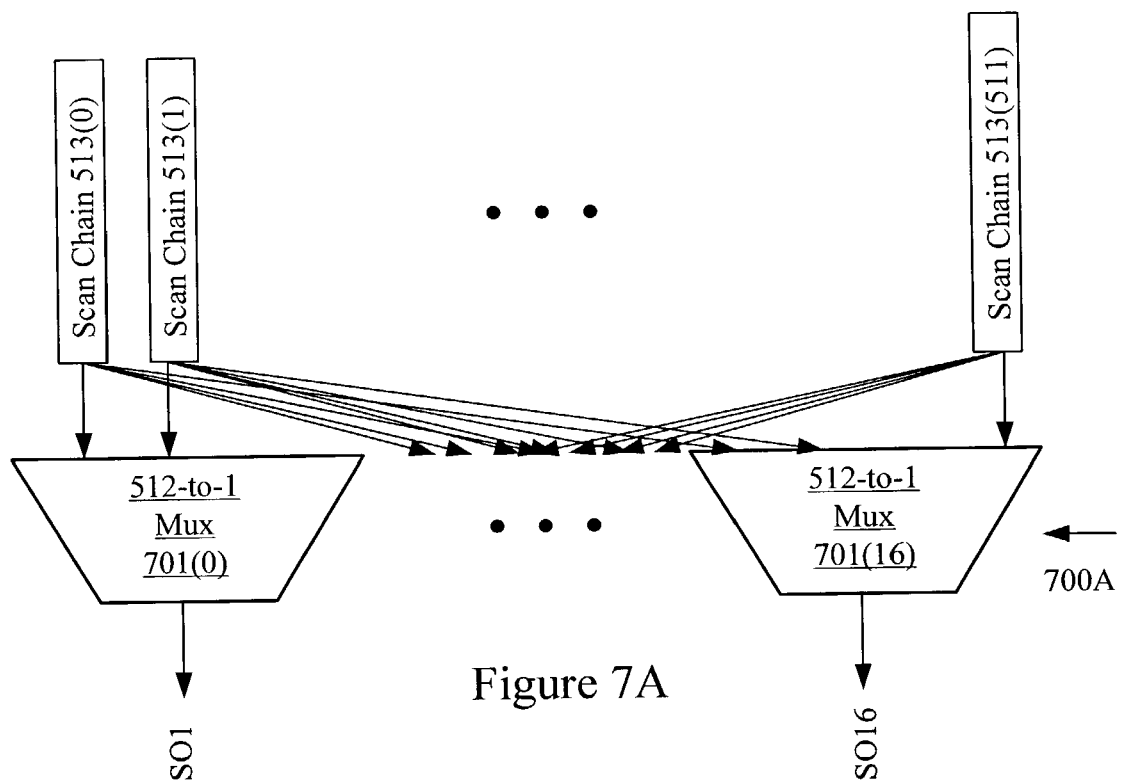
FIG. 7A illustrates a fully connected scan-out selector, i.e. every scan chain connects to each multiplexer.

FIG. 7A illustrates a fully connected scan-out selector 700A, i.e. every scan chain 513(0)–513(511) connects to each multiplexer 701(0)–701(16). In this configuration, any subset of 16 scan chains can be observed. However, scan-out selector 700A has a high overhead including gate count, delay, and wiring. Specifically, scan-out selector 700A includes 16 512-to-1 multiplexors 701, which is equivalent to 8176 2-to-1 multiplexors. Moreover, each path from a scan chain 702 to the output of a multiplexer 701 passes through nine 2-to-1 multiplexors, thereby likely exceeding a typical clock cycle time. (Note that generally a signal can pass through 20 simple logic gates within one clock cycle. However, a multiplexer is a complex logic gate that roughly corresponds to 2+ simple logic gates.) Additionally, each scan chain 702 has a fan-out of 16 wires and each multiplexer 701 has fan-in of 521 wires, i.e. 512 data inputs and 9 select inputs, thereby adding significant area and delay. This high overhead can make commercialization of scan-out selector 700A impractical.

Figure 7B:
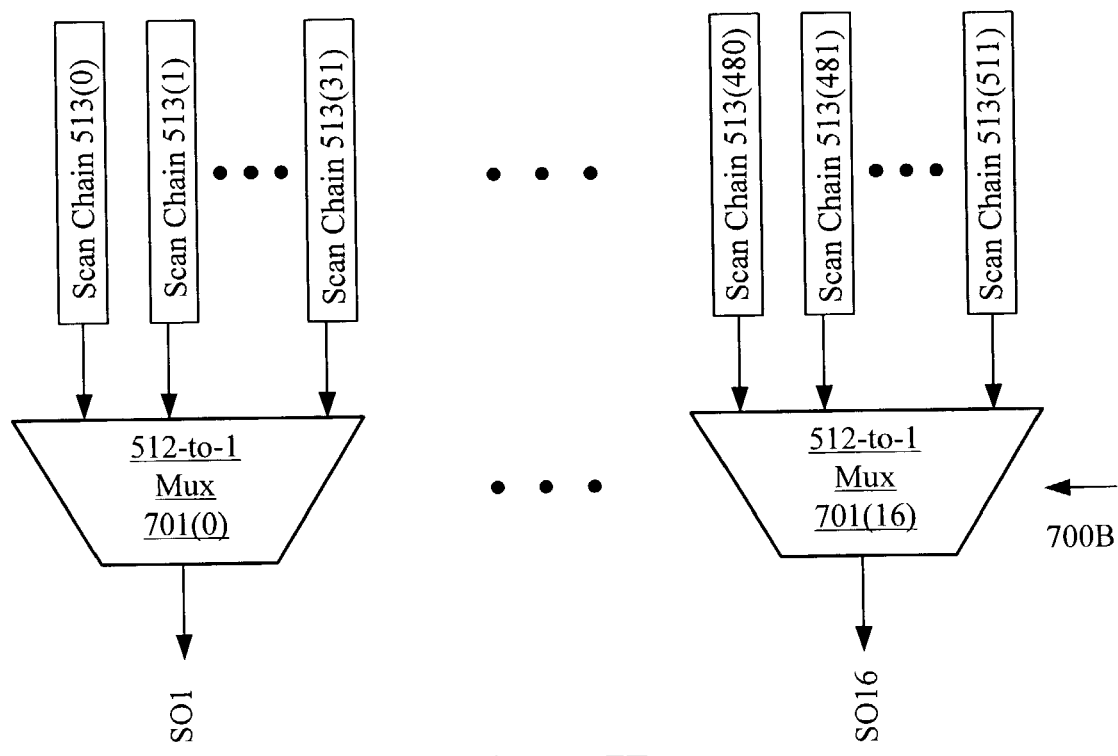
FIG. 7B illustrates a minimally connected scan-out selector, i.e. each multiplexer receives outputs from a fixed set of scan chains.

In contrast, FIG. 7B illustrates a minimally-connected scan-out selector 700B, i.e. each multiplexer receives outputs from a fixed set of 32 scan chains 513. This configuration has significantly lower overhead than scan-out selector 700A. Specifically, scan-out selector 700B includes 16 32-to-1 multiplexors 701, which is equivalent to only 496 2-to-1 multiplexors. Moreover, each path from a scan chain 513 to the output of a multiplexer 701 passes through only five 2-to-1 multiplexors. Additionally, each scan chain 513 has only one fan-out wire and each multiplexer 701 has a fan-in of only 37 wires, i.e. 32 data inputs and 5 select inputs, thereby adding minimal area and delay. However, scan-out selector 700B significantly limits which subsets of scan chains 513 can be observed simultaneously. For example, as described previously, selecting one scan chain means that 31 other scan chains cannot be observed in the same pattern.

To evaluate the performance of the selector (and thus the efficiency of XDBIST patterns), the probability of successfully observing all chains in a randomly-selected subset of up to 16 chains can be determined. In one embodiment, this probability can be derived experimentally by generating 1000 random selections for each subset size (i.e. 1 to 16) and then determining if the selected chains can all be routed to scanout pins. Table 1 shows the results using a simple selector, such as selector 700B in FIG. 7B. During test generation, the targeted faults from a test pattern are removed from the active fault list, thereby ensuring that no future test generation effort is spent on the same faults. At this point, the fault simulator determines all faults detected by another pattern. Note that these detected faults typically include the faults targeted by the test generator as well as other serendipitously detected faults. Once again, all detected faults are removed from the active fault list. Unfortunately, if selector 700B is used to observe the scan chains, many targeted faults will end up undetected because the fault effects propagate to scan cells in unobserved chains. However, from a test generation perspective, these faults are no longer "active" and thus can only be serendipitously detected. In practice, many of these faults would remain undetected, thereby significantly reducing the test coverage of XDBIST patterns.

To alleviate this problem, the test program could start by selecting a first chain (which can always be observed) and generate a test pattern for as many target faults as possible that are observed in this first scan chain. To keep the total number of pattern low, tests for additional target faults can be merged into the same pattern. The additional target faults can be selected so that they can be observed in a second scan chain that can be routed to a scan-out pin at the same time with the first scan chain. Similarly, additional scan chains (up to 16) are added to the subset. Unfortunately, as shown in Table 1, finding additional scan chains that can all be routed simultaneously with selector 700B (FIG. 7B) quickly becomes very unlikely and would require unacceptably long CPU time. Thus, a simple selector is also commercially impractical.

TABLE 1

COMPARISON OF SELECTORS

| Number of Scan Chains Selected | Probability To Observe All Selected Chains (FIG. 7B) | Probability To Observe All Selected Chains (FIG. 8A) | Probability To Observe All Selected Chains (FIG. 9) |
|---|---|---|---|
| 1 | 100% | 100% | 100% |
| 2 | 93.10% | 100% | 100% |
| 3 | 88.10% | 100% | 100% |
| 4 | 77.00% | 100% | 100% |
| 5 | 65.20% | 100% | 99.90% |
| 6 | 51.70% | 100% | 99.80% |
| 7 | 41.60% | 100% | 99.50% |
| 8 | 29.30% | 100% | 98.70% |
| 9 | 18.70% | 100% | 96.40% |
| 10 | 10.70% | 100% | 95.50% |
| 11 | 5.60% | 100% | 92.30% |
| 12 | 3.10% | 100% | 86.80% |
| 13 | 1.70% | 99.60% | 81.60% |

TABLE 1-continued

COMPARISON OF SELECTORS

| Number of Scan Chains Selected | Probability To Observe All Selected Chains (FIG. 7B) | Probability To Observe All Selected Chains (FIG. 8A) | Probability To Observe All Selected Chains (FIG. 9) |
|---|---|---|---|
| 14 | 0.90% | 98.60% | 74.40% |
| 15 | 0.00% | 92.70% | 61.40% |
| 16 | 0.00% | 70.40% | 43.70% |

Figure 8A:
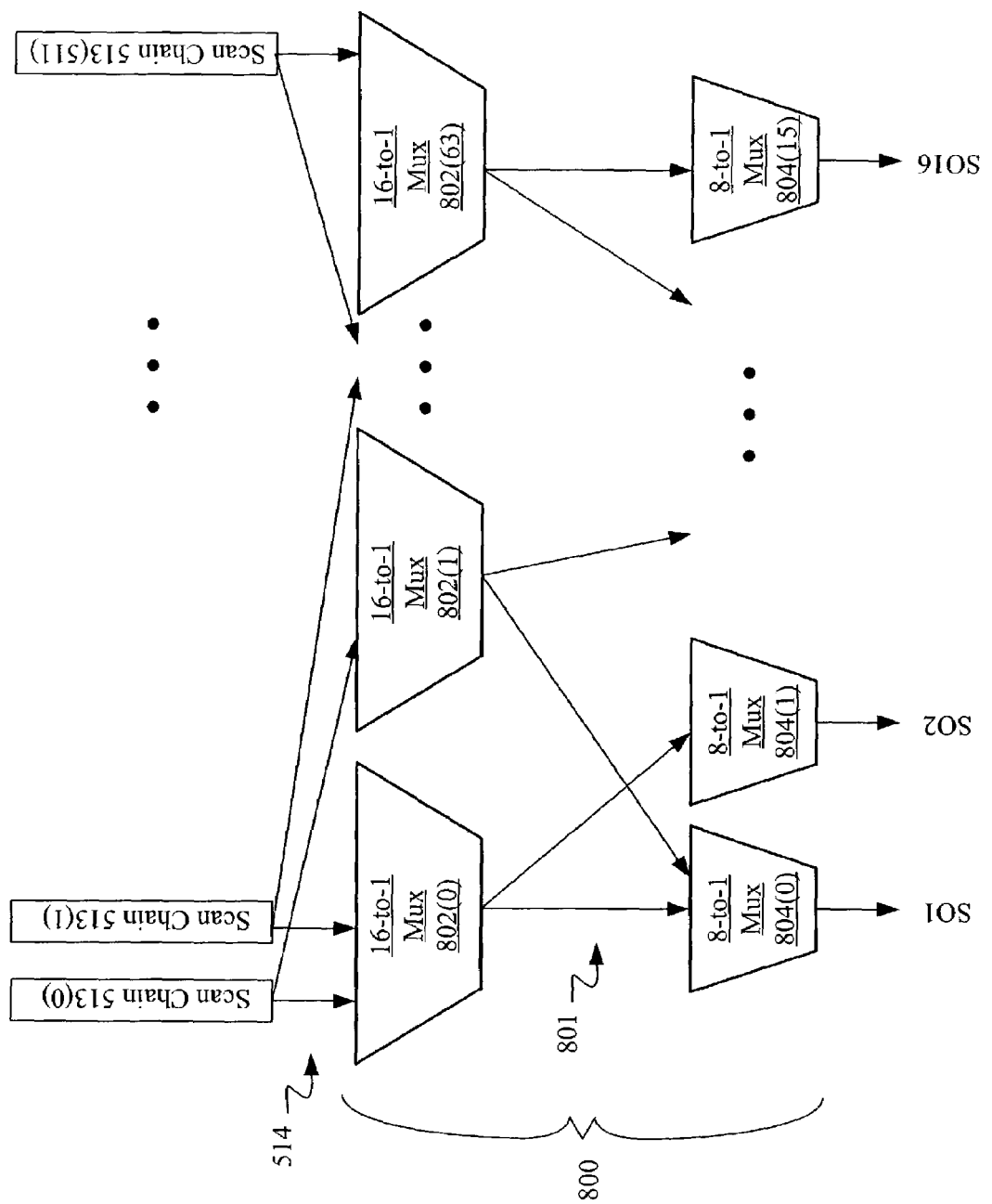
FIG. 8A illustrates an exemplary multi-stage scan-out selector that can ensure a high probability of observing many selected scan chains while providing the desired compression.

FIG. 8A illustrates an exemplary multi-stage scan-out selector 800 providing the desired compression that can ensure a high probability of observing many selected scan chains with low area overhead. For example, multi-stage scan-out selector 800 can provide a compression of 512 scan chain outputs (513(0)–513(511)) to 16 scan output pins (SO1–SO16). In one embodiment, a first stage including multiplexers 802 (implemented as 16-to-1 multiplexers) can provide a first compression and a second stage including multiplexers 804 (implemented as 8-to-1 multiplexers) can provide a second compression. These 64 multiplexers 802 (0)–802(15) and 16 multiplexers 804(0)–804(15) are equivalent to a total of 1072 2-to-1 multiplexers. In this configuration, each path from a scan chain to a scan-out pin passes through seven 2-to-1 multiplexors. Note that the highest multiplexer fan-in for multiplexers 802 is 20 (i.e. 16 data inputs and 4 select inputs) and the highest multiplexer fan-in for multiplexers 804 is 11 (i.e. 8 data inputs and 3 select inputs).

In accordance with one feature of the invention, the connections between scan chains 513 and multiplexers 802 as well as between multiplexers 802 and multiplexers 804 are chosen to maximize the probability that randomly selected inputs can be routed to outputs at their level. Note that this routing selection is significantly more challenging than single-level scan-out selector 700B (FIG. 7B).

For example, routing an output from scan chain 513(0) through multiplexer 802(0) means that an output from scan chain 513(1) (assuming it is also needed) cannot be routed through multiplexer 802(0). Instead, the output from scan chain 513(1) must be routed through the other multiplexer 802 to which it is connected. However, if this other multiplexer 802 is already allocated to another scan chain output, then scan chain 513(1) is blocked. To resolve this blockage, the output of scan chain 513(0) could be routed through multiplexer 802(1), thereby allowing the output of scan chain 513(1) to be routed through multiplexer 802(0). However, providing a routing function that searches all possible routing options to determine if a solution exists for the selected subset of scan chains would take considerable computing resources.

Figure 8B:
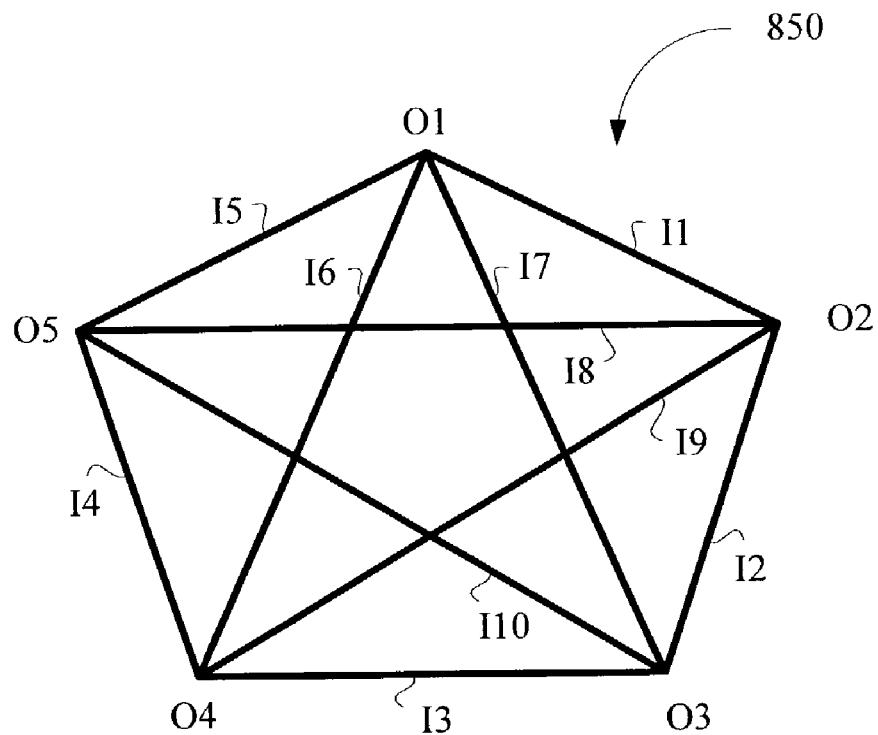
FIG. 8B illustrates an exemplary cage that can be used in routing analysis.

The probability of successfully routing all chains of a selected subset to scan output pins depends on the connections in FIG. 8A and on the routing function. In one embodiment, each input, i.e. scan chains 513(0)–513(511), fans out to two first-stage outputs, i.e. 16-to-1 multiplexers 802(0)–802(63). This configuration can be represented as a graph 850 in FIG. 8B, with inputs as edges and outputs as vertices. In graph 850, an edge (i.e. an input) connects the two vertices (i.e. the outputs) that the input fans out to. For example, scan chain 513(0) fanning out to multiplexers 802(0) and 802(1) can be represented as an edge "513(0)" connecting vertices "802(0)" and "802(1)". Vertex "802(0)" also connects through edge "513(1)" to some other vertex, etc. Similarly, the second stage of multi-stage scan-out selector 800, i.e. from multiplexers 802 as inputs to scan outputs SO1–SO16 can be represented as another graph. For the more general case that an input connects to more than 2 outputs, the representation becomes a hyper-graph.

Routing selected inputs to available outputs can be analyzed for each of the two levels of multi-stage scan-out selector 800 as uniquely assigning vertices to selected edges. Specifically, if a set of p edges spans at least p vertices, then such assignment is possible. Otherwise, the assignment is not possible. A set of p edges that spans the minimal number of vertices, which occurs when the p edges form a cycle, spans only p vertices. For example, in graph 850, a cycle can be represented by vertices O1, O4, and O5 and edges I6, I4, and I5. If the smallest number of edges on any cycle of the graph is g, then any g edges can be assigned unique vertices. Graphs of maximal g (given the number of edges and vertices) are related to "cages". Cages and graphs are explained in further detail by J. A. Bondy and U.S.R. Murty in *Graph Theory with Applications*, a part of the North-Holland Mathematics Studies, published by Elsevier Science in 1976.

Figure 8C:
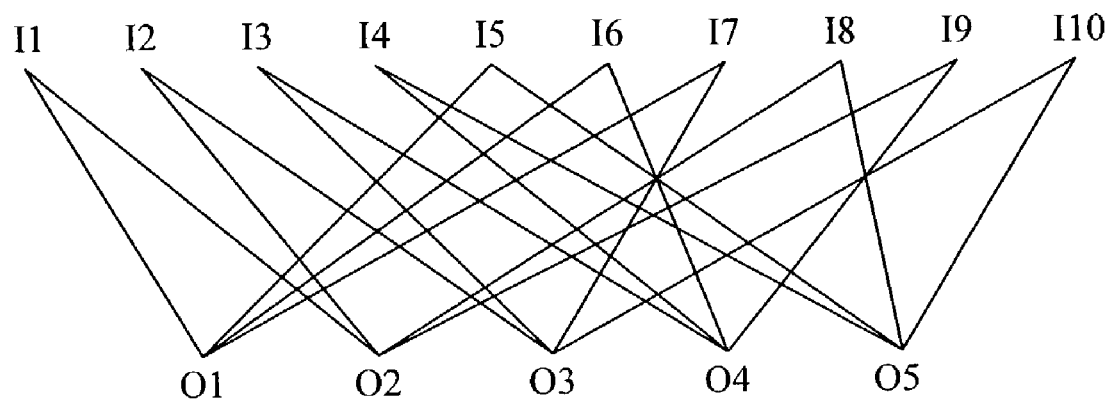
FIG. 8C illustrates the simple selector based on the cage of FIG. 8B.

Building each selector level on a cage ensures that any number of inputs, up to at least g, can be routed to outputs with minimal congestion. Selecting more than g inputs may still have a good chance of being routable to outputs. For example, FIGS. 8B and 8C respectively illustrate an exemplary cage of g=3 and a selector having 10 inputs and 5 outputs based on that cage. Of importance, cages that substantially represent the levels of multi-state scan-out selector 800 can be constructed. Attachment A provides a complete Verilog netlist for an exemplary multi-stage scan-out selector. Table 1 (above) shows that by using the selector of FIG. 8A, and assuming multiplexers 802 and 804 can be selected as needed, a 100% success rate up to 12 scan chains and even a 92.70% success rate up to 15 scan chains can be achieved.

Figure 8D:
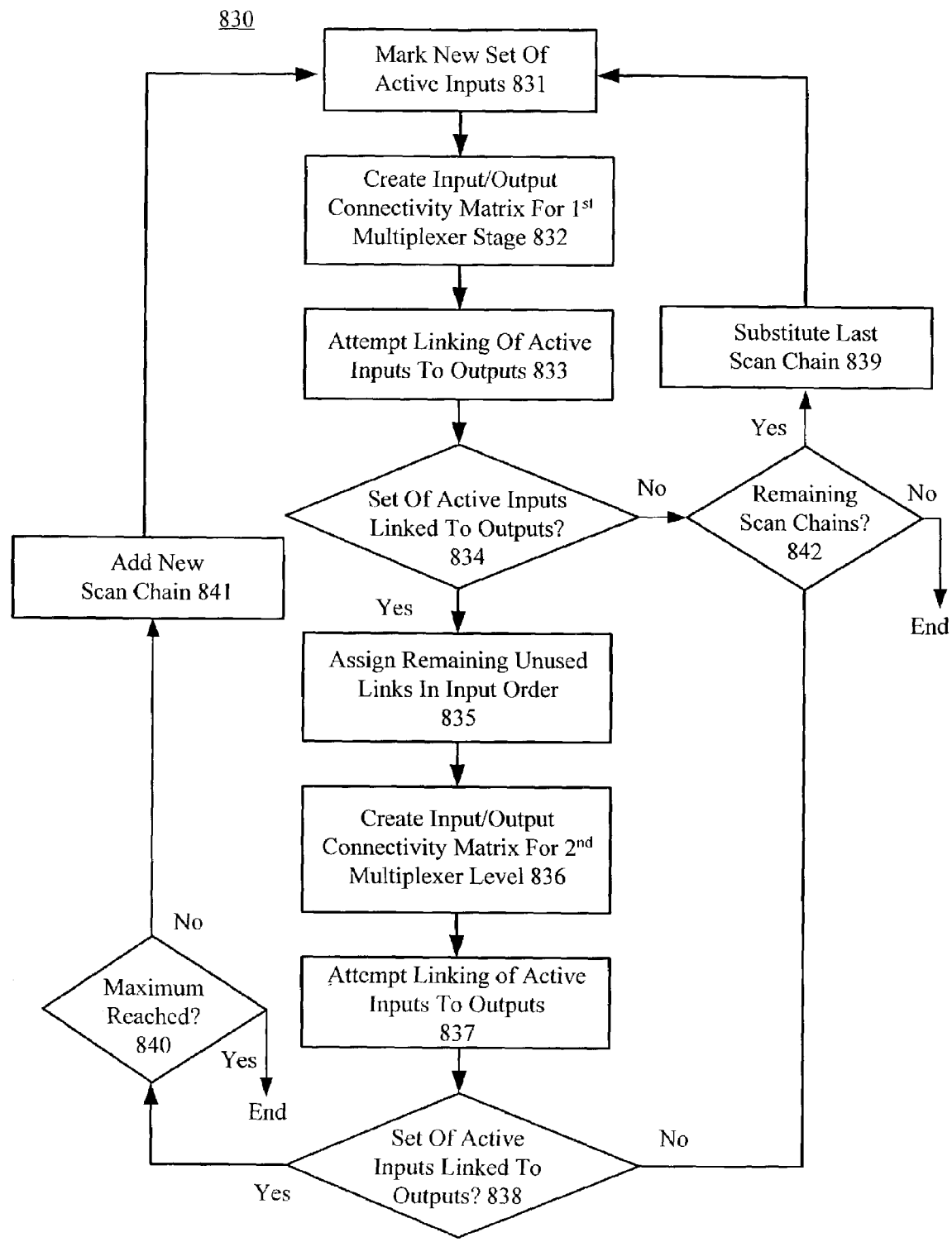
FIG. 8D illustrates a routing function algorithm that can be used to route a signal through the multi-stage scan-out selector of FIG. 8A.

FIG. 8D illustrates a routing function algorithm 830 that can be used to route a signal through multi-stage scan-out selector 800. In step 831, a set of scan chains selected for observation (e.g. up to 16 out of the 512 chains) can be marked as active inputs. In step 832, a connectivity matrix can be built with inputs (e.g. 512) as rows and outputs (e.g. 64) as columns for the first level of the scan-out selector (e.g. multiplexers 802 in FIG. 8A). In one embodiment, a matrix element (i, j) is non-zero if there is a connection from input i to output j. Inputs can then be linked to outputs in step 833. FIG. 8E illustrates one embodiment of pseudo-code 845 for implementing step 833.

In pseudo-code 845, for each output connected to only one active input, the input is linked to the output. Then, the input can be marked inactive, the output can be marked as used, and the input row in the connectivity matrix can be cleared. Additionally, for each input connected to only one unused output, the input is also linked to the output. Then, the input can be marked inactive, the output can be marked as used, and the output column in the connectivity matrix can be cleared. Once outputs connected to only one active input and inputs connected to only one unused output are addressed, then an input of an output that connects to least active inputs can be routed. At this point, the input can be marked inactive and the output can be marked as used. Using this methodology, pseudo-code 845 advantageously minimizes routing congestion. Note that referring back to FIG. 8A, if a scan chain output is provided to only two multiplexers in first stage multiplexer array 802, then the "least active input" would be only one. In other words, this portion of pseudo-code 845 would not be needed for routing associated with first stage multiplexer array 802. However, in second stage multiplexer array 804, the "least active input" would be two, i.e. each scan chain 513 is selectively coupled to four multiplexers 804.

FIG. 8F illustrates a simplified connectivity matrix 860 including 10 inputs and 5 outputs. In accordance with pseudo-code 841, if output 3 is connected to only one active input, for example input 4, then input 4 can be marked inactive, output 3 can be marked as used, and, with the exception of the intersection of input 4 and output 3 (which is marked with a one), input row 4 can be cleared (in this case, marked with zeros). In a similar manner, if input 8 is connected to only one unused output, for example output 5, then input 8 is linked to output 5. Then, input 8 can be marked inactive, output 5 can be marked as used, and, with the exception of the intersection of input 8 and output 5 (which is marked with a one), output column 5 can be cleared (in this case, marked with zeros). In further accordance with pseudo-code 845, after outputs connected to only one active input and inputs connected to only one unused output are addressed, an input of an output that connects to least active inputs can be routed. For example, if input 7 is coupled to outputs 1 and 2 and if input 8 is coupled to output 2, then input 8 should be linked to output 2. At this point, input 8 can be marked inactive, output 2 can be marked as used, and the rest of column 2 can be cleared.

Referring back to FIG. 8D, if the set of active inputs cannot be routed to at least one multiplexer 802 output as determined in step 834, then a routing problem is identified. Specifically, in one embodiment, the test generator can select a set of scan chains (e.g. starting with one scan chain) for observation (i.e. the set of active inputs in step 831). Upon successful routing through the first and second multiplexer stages (described in reference to steps 838, 840, and 841), an additional scan chain can be added to the set of active inputs. Therefore, in one embodiment, if the last selected active input cannot be successfully routed to an output of the first multiplexer stage and remaining scan chains are available (as determined in step 842), then the test generator (which is notified of the routing problem) can substitute a new scan chain for the last scan chain in step 839 to see if that new scan chain can be successfully routed. (Note that if no remaining scan chains are available, then the process ends.)

Thus, steps 831–834 and 839 can be iteratively performed for each new set of active inputs (up to 16 in this embodiment). The test generator continues this process until either the desired number scan chains are successfully routed or no more scan chains can be routed (see step 842). Note that 16 scan chains can typically be routed with ease during the beginning of a test cycle. Fortunately, as testing continues, the number of scan chains needed to test the remaining faults decreases dramatically. Thus, referring to Table 1, the probability of routing such limited number of scan chains remains high (both for FIG. 8A (described above) and FIG. 9 (described below)).

If the set of active inputs can be routed to outputs in the first multiplexer stage, then the remaining unused input-to-output links can be assigned in order of inputs in step 835. In other words, the active inputs are a subset of the total inputs to the first stage (e.g. up to 16 of 512). Next, in step 836, the second level connectivity matrix can be built, including the multiple paths through multiplexers 804. The linking algorithm, i.e. pseudo-code 845, of FIG. 8F can also be applied for the second connectivity matrix in step 837. If the set of active inputs cannot be routed to outputs as determined in step 838, then the process can return to step 839, wherein the last added scan chain is substituted with a new scan chain. Steps 831–839 can be iteratively performed for each scan chain added until the set of active inputs can be routed. If the set of active inputs can be routed to outputs of the second multiplexer stage (i.e. multiplexers 804), then the routing operation for that set of active has succeeded. At this point, if the maximum set of active inputs is not yet reached (up to 16 in this embodiment), as determined in step 840, then a new scan chain can be added in step 841. Then, the process returns to step 831. If the maximum set of active inputs is reached and more faults still need to be tested, then routing of active inputs for another pattern can be analyzed.

Figure 9:
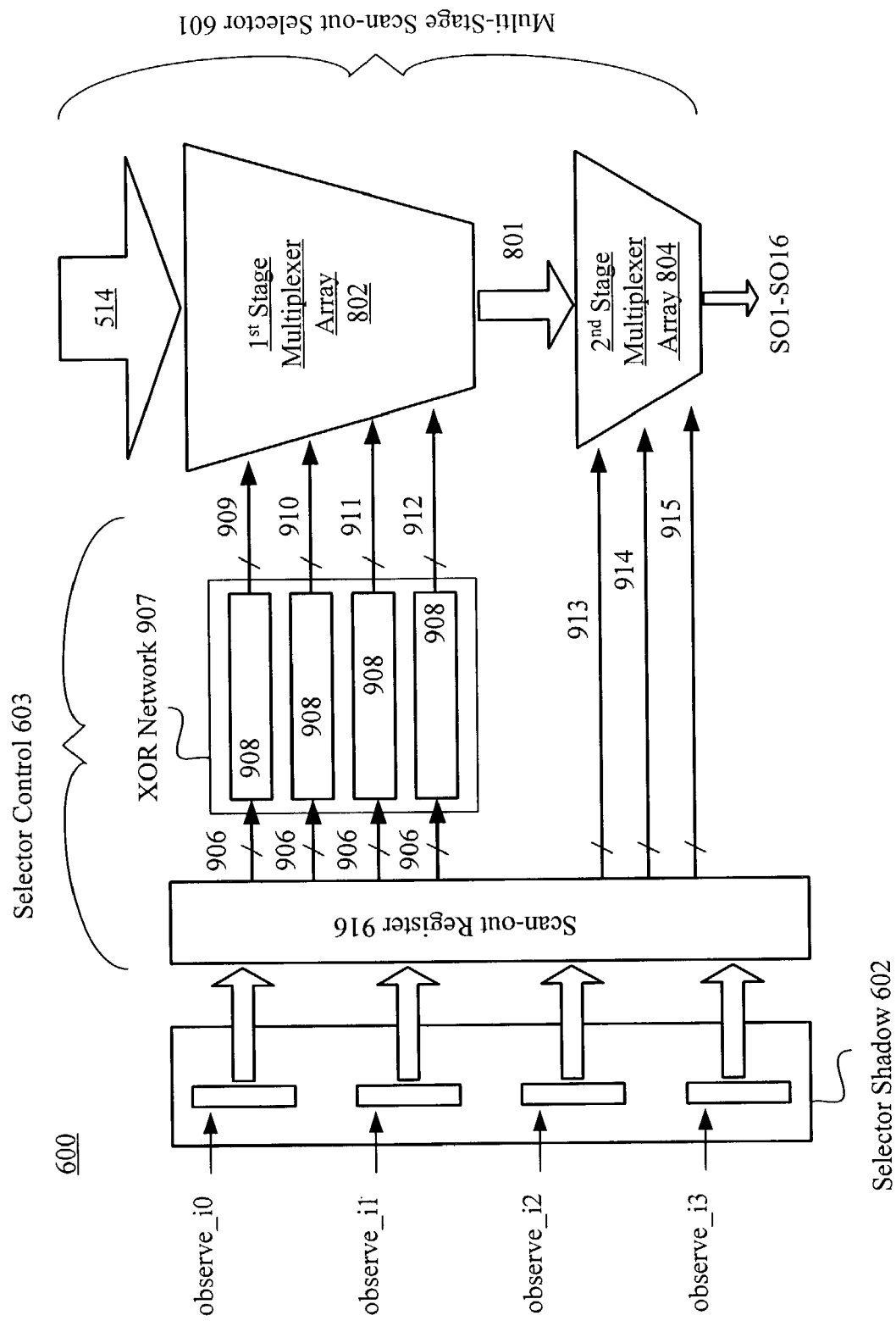
FIG. 9 illustrates a more detailed embodiment of the observe selector of FIG. 6.

FIG. 9 illustrates a more detailed embodiment of observe selector 600 including multi-stage scan-out selector 601. Scan-out selector 601 can be implemented using multiplexers 802 (first stage) and multiplexers 804 (second stage) (both described in reference to FIG. 8A). Arrows 514 and 801 refer to the 512 scan chain outputs and the 64 intermediate outputs of multiplexers 802, respectively.

In accordance with one feature of the invention, a selector shadow 602 can receive a seed created by a test generator and applied by a tester. In one embodiment, selector shadow 602 can include four registers, each register having 40 bits. A segment of a seed (i.e. observe_i0, observe_i1, observe_i2, or observe_i3) can be loaded into each of the registers of selector shadow 602. By loading the registers of selector shadow 602 in parallel, selector shadow 602 can provide a new seed to scan-out selector 603 (which has a scan-out register 916 having the same length as selector shadow 602) in only M clock cycles (in this embodiment, 40 clock cycles). In one embodiment, scan-out register 916 can have a simple register configuration of 160 flip-flops, which provide outputs to select buses 906, 913, 914, and 915.

For example, scan-out register 916 outputs a set of intermediate control signals to an XOR network 907 via select buses 906. In one embodiment, XOR network 907 includes four sub-networks 908, each sub-network 908 having 64 2-input XOR gates in a single stage. XOR network 907 can be used because only 16 of the 64 multiplexers 802 actually provide scan outputs to multiplexers 804. Specifically, to provide full control of all 64 multiplexers 802, a total of 256 (64×4) bits would be required. However, XOR network 907 can advantageously provide control over which 16 multiplexers 802 should be selected with only 112 bits (each select bus 906 providing 28 intermediate control signals). XOR network 907 can also be represented as a graph with inputs as edges and outputs as vertices.

Scan-out register 916 also outputs sets of control signals on select buses 913, 914, and 915 to multiplexers 804. In one embodiment, each of these select buses provides 16 bits. Note that an XOR network is not necessary for selection of multiplexers 802 because each of the 16 multiplexers 804 will output a scan output. Scan-out register 916 can be clocked, i.e. output its control signals on select buses 906, 913, 914, and 915, when a new seed for selector shadow 602 is loaded.

As described previously, multiplexers 802 are 16-to-1 multiplexers. Therefore, each multiplexer 802 requires 4 control bits. In one embodiment, the control signals on select bus 909 can provide a first selector bit for each of the 64 multiplexers 802. Similarly, the control signals on select bus 910 can provide a second selector bit, the control signals on select bus 911 can provide a third selector bit, and the control signals on select bus 912 can provide a fourth selector bit.

Also as described previously, multiplexers 804 are 8-to-1 multiplexers. Therefore, each multiplexer 804 requires 3 control bits. In one embodiment, the control signals on select bus 913 can provide a first selector bit for each of the 16 multiplexers 804. Similarly, the control signals on select bus 914 can provide a second selector bit and the control signals on select bus 915 can provide a third selector bit.

Of importance, the XDBIST architecture maximizes the probability that (1) a routing path can be established for designated scan outputs in multi-stage scan-out selector 601 and (2) the multiplexers used in this routing path can receive the appropriate control bits. The routing path described in reference to FIG. 8A increases the probability of success by providing alternative paths for each scan chain at each stage in the selector. XOR network 907 allows significant manipulation of the control bits to multi-stage scan-out selector 601. Table 1 shows that using multi-stage selector 601, in conjunction with XOR network 907 in selector control 603, provides a 100% success rate up to 4 scan chains and even a 92.30% success rate up to 11 scan chains. Recall that in the last half of the patterns only about 4 of the 16 scan chains are needed. Therefore, multi-stage scan-out selector 601 in combination with selector control 603 ensures that the designated scan outputs can be successfully observed.

In accordance with one feature of the invention, the test generator can advantageously use the probability that a routing solution can be found, thereby minimizing computing resources. Specifically, in one embodiment, a routing program could consecutively add scan chains until the selector program indicates that it cannot successfully provide the appropriate control signals to the multiplexers to establish the proposed routing. At this point, the routing program could determine whether to try to add another scan chain. This determination can be based on the probability to observe the outputs of those scan chains. For example, if the probability of observing the outputs with the to-be-added scan chain is greater than a predetermined percentage, e.g. 98%, then the routing program would attempt to add that scan chain. Otherwise, the routing program would start adding scan chains for the next pattern.

In accordance with one feature of the invention, the selection of multiplexers 802 and 804 does not change for one full unload of a pattern. In other words, in an embodiment of scan chains with length 40, the selection of multiplexers 802 and 804 would not change for 40 cycles.

FIG. 10 shows an exemplary code portion 1000 for an XDBIST pattern that could be provided to a tester. Note that when mapping deterministic ATPG patterns to XDBIST patterns, only the load_unload operation is changed. However, forcing primary inputs ("forcePI"), measuring primary outputs ("measurePO"), and capturing cycles ("capture") remain unchanged. The macro "shadows_load_unload" loads PRPG seed and observes selection data for the next pattern (i+1), while unloading the selected scan chains of the previous pattern (i−1) and loading the scan chains with data of the current pattern (i).

FIG. 11 shows an exemplary "shadows_load_unload" macro 1100. In macro 1100, a loop of 10 cycles simply pulses the clocks to shift the internal scan chains (assumed here to be 10 bit longer than the shadow registers, thus length 42). In the Shift block, the 8 PRPG shadow registers "shadow_si1" . . . "shadow_si8" are loaded, the 7 observe inputs "observe_i1" . . . "observe_i7" get select data and the write-enable input "observe_i8" toggles between 0 (address-load cycle) and 1 (register write cycle). At the same time, the 16 scan outputs "SO1" . . . "SO16" are unloaded, and the clocks are pulsed. Finally, after the Shift, the "shadow_transfer" input is conditioned to 1, so that the next clock pulse will transfer the content of the shadow registers into the working register.

Figure 12:
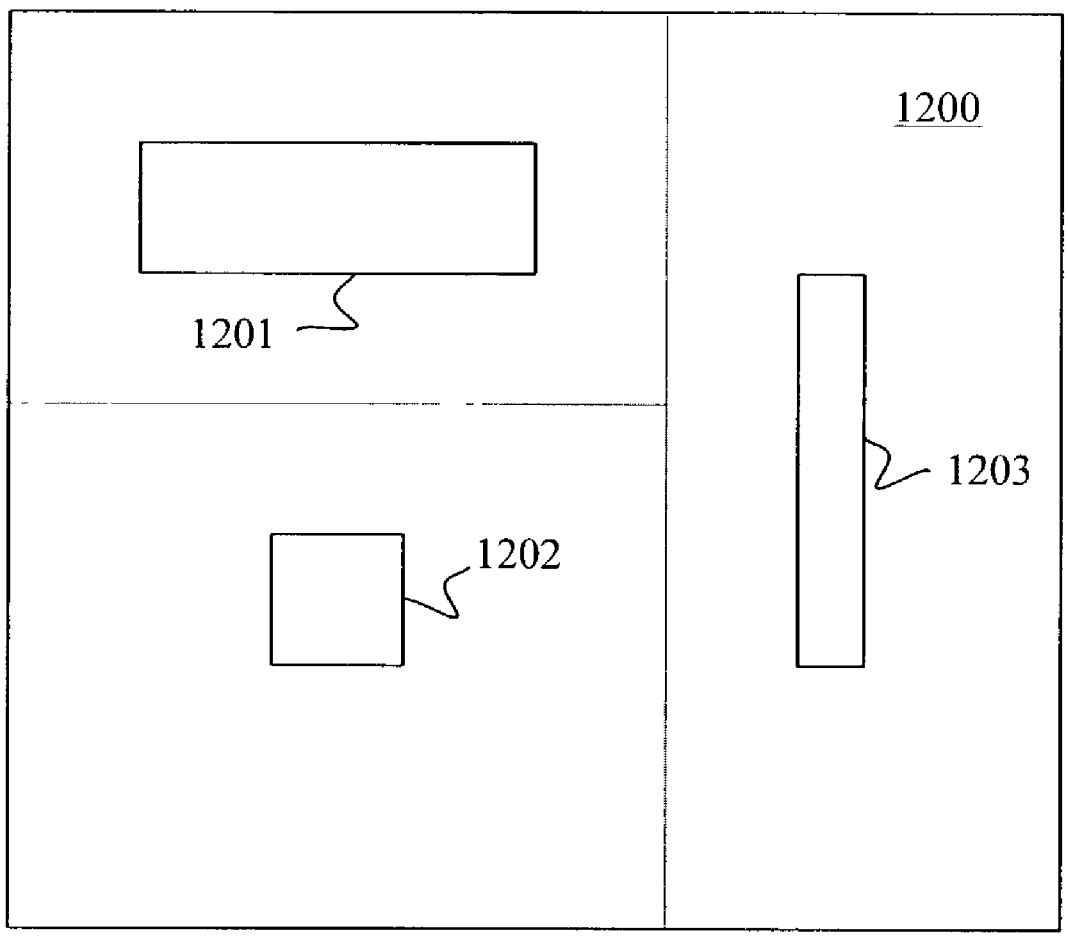
FIG. 12 illustrates a design including multiple XDBIST controllers (called CODECs).

In one embodiment of the invention, multiple XDBIST (or DBIST) controllers could be placed in a design. For example, FIG. 12 illustrates a design 1200 including multiple XDBIST (or DBIST) controllers 1201, 1202, and 1203. Note that each controller, also called a CODEC (for compression/decompression), could include an XDBIST architecture such as that shown in FIG. 6 (that is, all structures shown therein with the exception of tested design 510). CODECs 1201, 1202, and 1203, having same or different sizing, can be strategically placed within design 1200 to minimize routing from the scan chains (located in proximity to the CODECs). Specifically, most designs are wire limited (i.e. gates tend to shrink faster than wires). Therefore, providing multiple CODECs reduces the total wiring needed by a design. Moreover, multiple CODECs place only local routing limitations on a design. Because routing is more easily resolved inside a logical partition (e.g. referring to the dotted lines in FIG. 12), multiple CODECs advantageously reduce routing complexity. Furthermore, including multiple CODECs in a design provides more control (i.e. multiple PRPGs are used) and observability (i.e. more scan outputs can be used).

Figure 13:
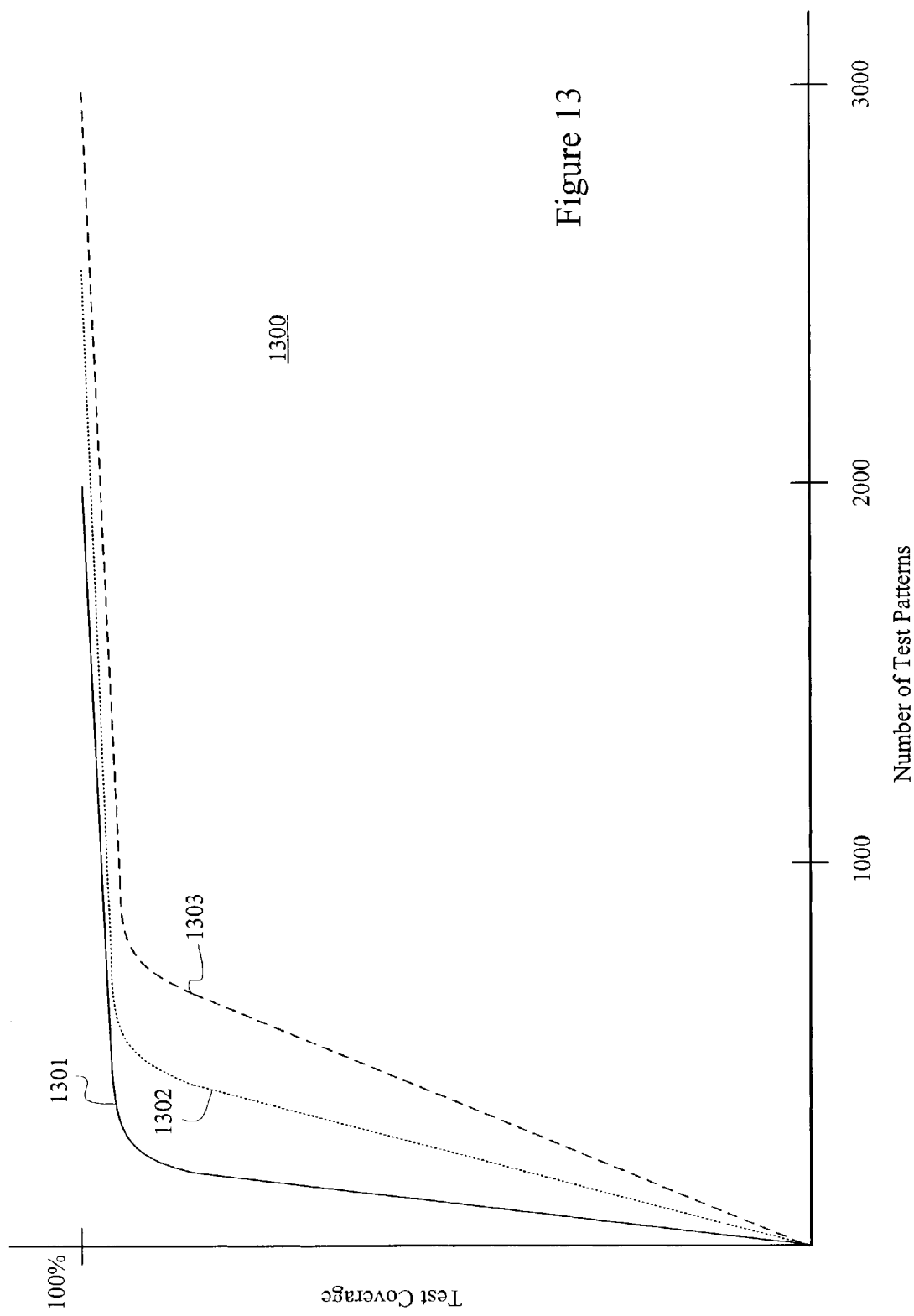
FIG. 13 shows a graph comparing deterministic ATPG, DBIST, and XDBIST in achieving 100% test coverage.

FIG. 13 illustrates a graph 1300 comparing deterministic ATPG, DBIST, and XDBIST in achieving 100% test coverage. As shown in graph 1300, deterministic ATPG (1301) quickly achieves approximately 95% test coverage after using only 200 test patterns. However, to reach 100% test coverage, deterministic ATPG typically uses approximately 2000 patterns. DBIST implementations (1302) can also quickly achieve approximately 95% test coverage after using 500 test patterns. To reach 100% test coverage, DBIST typically uses approximately 2500 patterns. XDBIST implementations (1303) can also quickly achieve approximately 95% test coverage after using 700 test patterns. To reach 100% test coverage, XDBIST typically uses approximately 3000 patterns. Thus, after using approximately 700 test patterns, all three methodologies can achieve over 95% test coverage.

However, as described herein XDBIST can significantly reduce test data volume and tester cycles, as compared to deterministic ATPG patterns. Unlike BIST solutions, XDBIST does not change the core logic of the device under test (DUT). Specifically, no test points or blockage logic for uncertain bits need be inserted. In accordance with one feature of the invention, XDIST includes test logic, e.g. linear feedback shift registers (LFSRs), between the test pins and the internal scan chains. In this configuration, the tester views the DUT as a conventional scan-based design. All pattern load data is controlled by LFSR seeds so that all "care bits" (i.e. scan cells that must be set to a certain value) can be set, while other scan cells can be set to pseudo-random values from the LFSR. In XDBIST, specific scan cells or scan chains are selectively observed for each pattern, while also pseudo-randomly observing other scan cells. As a result, the DUT advantageously appears as having fewer scan cells, thereby resulting in 10× test data and 5× tester cycles reduction.

OTHER EMBODIMENTS

Although illustrative embodiments of the invention have been described in detail herein with reference to the accompanying figures, it is to be understood that the invention is not limited to those precise embodiments. They are not intended to be exhaustive or to limit the invention to the precise forms disclosed.

For example, selecting a fixed number of scan chains for observation for each pattern can also be achieved in the XDBIST architecture of FIG. 5A by including standard gating logic to receive the clock provided to observe LFSR 503. This gating logic can also receive an additional bit (for example, scanned in with the seed for observe shadow 502), which can control whether observe LFSR 502 should be advanced during the unload. In this configuration, the test generator is limited to selecting 16 chains for observation, instead of cells_observed cells. Moreover, the fault simulator can limit its simulation of observe selector 500 to after each pattern unload, instead of every cycle.

Note that in one embodiment, multi-stage scan-out selector 601 could be controlled by observe phase-shifter 504. In other words, an observe selector in that embodiment could include observe shadow 502, observe LFSR 503, observe phase-shifter 504, and multi-stage scan-out selector 601.

Further note that although the pseudorandom pattern generator (PRPG) can be implemented using a linear feedback shift register (LFSR), other types of PRPGs can also be used. For example, cellular automata can replace the PRPG-LFSR described herein. The cellular automata, like the PRPG-LFSR, includes a plurality of storage elements serially coupled and providing feedback to XOR functions. However, the cellular automata typically provides its feedback locally, e.g. to storage elements two or three elements to the right or left, whereas the PRPG-LFSR provides its feedback globally, e.g. to storage elements at the other end of the register. In another example, the size of the PRPG shadow, PRPG-LFSR, or the scan chain can vary from one embodiment to another. In yet another embodiment, the tester, instead of being run off-chip, can be implemented as a stand-alone device on chip. In such an embodiment, the data for the tester can also be provided/stored on chip.

Based on this disclosure, other modifications and variations will be apparent to practitioners skilled in this art. Accordingly, it is intended that the scope of the invention only be defined by the following claims and their equivalents.

The invention claimed is:

1. A system for testing a design implemented in an integrated circuit (IC), the design including a plurality of scan chains, the system comprising:
   a first linear feedback shift register (LFSR) for generating a first pattern from a first seed;
   a first phase-shifter for decompressing the first pattern from the first LFSR and providing the decompressed pattern to the plurality of scan chains; and
   an observe selector for selecting and reducing a number of predetermined scan chain outputs from the plurality of scan chains for testing, wherein the observe selector allows selected scan chain outputs to include any number of uncertain scan chain outputs.

2. The system of claim 1, further including a set of shadow registers, each shadow register including a plurality of storage elements serially coupled, wherein each shadow register receives a portion of the first seed.

3. The system of claim 1, wherein the observe selector comprises a scan-out selector.

4. A system for testing a design implemented in an integrated circuit (IC), the design including a plurality of scan chains, the system comprising:
   a first linear feedback shift register (LFSR) for generating a first pattern from a first seed;
   a first phase-shifter for decompressing the first pattern from the first LFSR and providing the decompressed pattern to the plurality of scan chains; and
   an observe selector for selecting predetermined scan chain outputs from the plurality of scan chains for testing, wherein the observe selector allows selected scan chain outputs to include any number of uncertain scan-chain outputs, wherein the observe selector comprises a scan-out selector, wherein the scan-out selector includes:
      a first set of multiplexers for receiving the scan chain outputs from the plurality of scan chains, each scan chain providing its scan chain output to two multiplexers in the first set of multiplexers; and
      a second set of multiplexers for receiving outputs from the first set of multiplexers, each multiplexer in the first set of multiplexers providing its output to two multiplexers in the second set of multiplexers, and each of the second set of multiplexers providing a scan output that can be observed by a tester.

5. The system of claim 4, wherein the observe selector further comprises a logic gate network for controlling the first set of multiplexers, but not the second set of multiplexers.

6. The system of claim 5, wherein the logic gate network includes XOR logic gates.

7. The system of claim 5, wherein the observe selector further comprises:
   a set of shadow registers, each shadow register including a plurality of storage elements serially coupled, wherein each shadow register receives a portion of a second seed; and
   a scan-out register for receiving the second seed once loaded and providing the loaded seed to the logic gate network and the second set of multiplexers.

8. The system of claim 3, wherein the scan-out selector includes:
   a set of multiplexers for receiving a fixed number of scan chain outputs from the plurality of scan chains, each of the set of multiplexers providing a scan output that is observable by a tester.

9. The system of claim 8, wherein the observe selector further comprises:
   a set of shadow registers, each shadow register including a plurality of storage elements serially coupled, wherein each shadow register receives a portion of a second seed;
   a second linear feedback shift register (LFSR) for generating a second pattern from the second seed; and
   a second phase-shifter for decompressing the second pattern from the second LFSR and using the decompressed pattern to control the set of multiplexers.

10. A design implemented in an integrated circuit (IC), the design comprising:
    a plurality of scan chains; and
    a plurality of BIST controllers, at least one BIST controller including:
    a first linear feedback shift register (LFSR) for generating a first pattern from a first seed;
    a first phase-shifter for decompressing the first pattern from the first LFSR and providing the decompressed pattern to the plurality of scan chains; and
    an observe selector for selecting and reducing a number of predetermined scan chain outputs from the plurality of scan chains for testing, wherein the observe selector allows selected scan chain outputs to include any number of uncertain scan chain outputs.

11. The design of claim 10, wherein at least two BIST controllers have different sizes.

12. The design of claim 10, wherein each BIST controller is located within a logical or physical partition.

* * * * *